US008614007B2

(12) United States Patent
Ye

(10) Patent No.: US 8,614,007 B2
(45) Date of Patent: Dec. 24, 2013

(54) THIN FILM SEMICONDUCTOR MATERIAL PRODUCED THROUGH REACTIVE SPUTTERING OF ZINC TARGET USING NITROGEN GASES

(71) Applicant: Applied Materials, Inc., Santa Clara, CA (US)

(72) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/765,198

(22) Filed: Feb. 12, 2013

(65) Prior Publication Data

US 2013/0146871 A1   Jun. 13, 2013

Related U.S. Application Data

(60) Continuation of application No. 13/074,783, filed on Mar. 29, 2011, now Pat. No. 8,398,826, and a division of application No. 11/829,037, filed on Jul. 26, 2007, now Pat. No. 7,927,713.

(60) Provisional application No. 60/914,582, filed on Apr. 27, 2007.

(51) Int. Cl.
*H01L 29/12* (2006.01)

(52) U.S. Cl.
USPC ............... 428/620; 257/43; 257/52; 257/63

(58) Field of Classification Search
USPC .................... 428/620; 257/43, 52, 63
See application file for complete search history.

(56) References Cited

U.S. PATENT DOCUMENTS

| 4,436,770 A | 3/1984 | Nishizawa et al. |
| 4,769,291 A | 9/1988 | Belkind et al. |
| 4,816,082 A | 3/1989 | Guha et al. |

(Continued)

FOREIGN PATENT DOCUMENTS

| CN | 1588623 A | 3/2005 |
| EP | 145403 A2 | 6/1985 |

(Continued)

OTHER PUBLICATIONS

Chinese Office Action dated Mar. 7, 2012 for Chinese Patent Application No. 200880015621.X.
Barnes et al. "A comparison of plasma-activated N2/O2 and N2O/O2 mixtures for use in ZnO:N. synthesis by chemical vapor deposition" Journal of Applied Physics vol. 96, No. 12 (Dec. 2004).

(Continued)

*Primary Examiner* — Tran Nguyen
(74) *Attorney, Agent, or Firm* — Patterson & Sheridan, LLP

(57) ABSTRACT

The present invention generally comprises a semiconductor film and the reactive sputtering process used to deposit the semiconductor film. The sputtering target may comprise pure zinc (i.e., 99.995 atomic percent or greater), which may be doped with aluminum (about 1 atomic percent to about 20 atomic percent) or other doping metals. The zinc target may be reactively sputtered by introducing nitrogen and oxygen to the chamber. The amount of nitrogen may be significantly greater than the amount of oxygen and argon gas. The amount of oxygen may be based upon a turning point of the film structure, the film transmittance, a DC voltage change, or the film conductivity based upon measurements obtained from deposition without the nitrogen containing gas. The reactive sputtering may occur at temperatures from about room temperature up to several hundred degrees Celsius. After deposition, the semiconductor film may be annealed to further improve the film mobility.

9 Claims, 12 Drawing Sheets

(56) References Cited

U.S. PATENT DOCUMENTS

| | | | |
|---|---|---|---|
| 4,983,360 | A | 1/1991 | Merdrignac et al. |
| 5,279,679 | A | 1/1994 | Murakami et al. |
| 5,346,601 | A | 9/1994 | Barada et al. |
| 5,352,300 | A | 10/1994 | Niwa et al. |
| 5,420,452 | A | 5/1995 | Tran et al. |
| 5,522,934 | A | 6/1996 | Suzuki et al. |
| 5,571,749 | A | 11/1996 | Matsuda et al. |
| 5,620,523 | A | 4/1997 | Maeda et al. |
| 5,668,663 | A | 9/1997 | Varaprasad et al. |
| 5,683,537 | A | 11/1997 | Ishii |
| 5,700,699 | A | 12/1997 | Han et al. |
| 5,716,480 | A | 2/1998 | Matsuyama et al. |
| 5,720,826 | A | 2/1998 | Hayashi et al. |
| 5,993,594 | A | 11/1999 | Wicker et al. |
| 6,150,668 | A | 11/2000 | Bao et al. |
| 6,153,013 | A | 11/2000 | Sakai et al. |
| 6,159,763 | A | 12/2000 | Sakai et al. |
| 6,180,870 | B1 | 1/2001 | Sano et al. |
| 6,228,236 | B1 | 5/2001 | Rosenstein et al. |
| 6,238,527 | B1 | 5/2001 | Sone et al. |
| 6,329,269 | B1 | 12/2001 | Hamada et al. |
| 6,388,301 | B1 | 5/2002 | Tawada et al. |
| 6,458,673 | B1 | 10/2002 | Cheung |
| 6,488,824 | B1 | 12/2002 | Hollars et al. |
| 6,556,180 | B1 | 4/2003 | Furuhashi et al. |
| 6,620,719 | B1 | 9/2003 | Andry et al. |
| 6,700,057 | B2 | 3/2004 | Yasuno |
| 6,787,010 | B2 | 9/2004 | Cuomo et al. |
| 6,825,134 | B2 | 11/2004 | Law et al. |
| 6,881,305 | B2 | 4/2005 | Black et al. |
| 6,943,359 | B2 | 9/2005 | Vardeny et al. |
| 6,953,947 | B2 | 10/2005 | Son et al. |
| 7,026,713 | B2 | 4/2006 | Hoffman et al. |
| 7,037,157 | B2 | 5/2006 | Murakami et al. |
| 7,145,174 | B2 | 12/2006 | Chiang et al. |
| 7,158,208 | B2 | 1/2007 | De Jager et al. |
| 7,189,992 | B2 | 3/2007 | Wager, III et al. |
| 7,235,810 | B1 | 6/2007 | Yamazaki et al. |
| 7,297,977 | B2 | 11/2007 | Hoffman et al. |
| 7,309,895 | B2 | 12/2007 | Hoffman et al. |
| 7,339,187 | B2 | 3/2008 | Wager, III et al. |
| 7,382,421 | B2 | 6/2008 | Hoffman et al. |
| 7,601,984 | B2 | 10/2009 | Sano et al. |
| 7,626,201 | B2 | 12/2009 | Chiang et al. |
| 7,629,191 | B2 | 12/2009 | Chiang et al. |
| 7,927,713 | B2 * | 4/2011 | Ye ............................ 428/620 |
| 8,398,826 | B2 | 3/2013 | Ye |
| 2003/0015234 | A1 | 1/2003 | Yasuno |
| 2003/0049464 | A1 | 3/2003 | Glenn et al. |
| 2003/0207093 | A1 | 11/2003 | Tsuji et al. |
| 2004/0018797 | A1 | 1/2004 | Murakami et al. |
| 2004/0113098 | A1 | 6/2004 | Vardeny et al. |
| 2004/0164294 | A1 | 8/2004 | Son et al. |
| 2004/0175511 | A1 | 9/2004 | Hartig |
| 2005/0017244 | A1 | 1/2005 | Hoffman et al. |
| 2005/0028860 | A1 | 2/2005 | Sano et al. |
| 2005/0062057 | A1 | 3/2005 | Yamazaki et al. |
| 2005/0062409 | A1 | 3/2005 | Yamazaki et al. |
| 2005/0067953 | A1 | 3/2005 | Yamazaki et al. |
| 2005/0181534 | A1 | 8/2005 | Yoshimi et al. |
| 2005/0233092 | A1 | 10/2005 | Choi et al. |
| 2005/0233595 | A1 | 10/2005 | Choi et al. |
| 2005/0251990 | A1 | 11/2005 | Choi et al. |
| 2006/0011139 | A1 | 1/2006 | Sterling et al. |
| 2006/0033106 | A1 | 2/2006 | Seo et al. |
| 2006/0038182 | A1 | 2/2006 | Rogers et al. |
| 2006/0043447 | A1 | 3/2006 | Ishii et al. |
| 2006/0046476 | A1 | 3/2006 | Nakamura et al. |
| 2006/0065299 | A1 | 3/2006 | Fukawa et al. |
| 2006/0108636 | A1 | 5/2006 | Sano et al. |
| 2006/0125098 | A1 | 6/2006 | Hoffman et al. |
| 2006/0258064 | A1 | 11/2006 | Chen et al. |
| 2007/0007125 | A1 | 1/2007 | Krasnov et al. |
| 2007/0030569 | A1 | 2/2007 | Lu et al. |
| 2007/0065962 | A1 | 3/2007 | Pichler |
| 2007/0068571 | A1 | 3/2007 | Li et al. |
| 2007/0141784 | A1 | 6/2007 | Wager et al. |
| 2007/0194379 | A1 | 8/2007 | Hosono et al. |
| 2008/0108198 | A1 | 5/2008 | Wager et al. |
| 2008/0132009 | A1 | 6/2008 | Hirai |
| 2008/0264777 | A1 | 10/2008 | Ye |
| 2008/0272388 | A1 | 11/2008 | Ushiyama et al. |
| 2008/0308411 | A1 | 12/2008 | Guo et al. |
| 2009/0026065 | A1 | 1/2009 | Nukeaw et al. |
| 2009/0045398 | A1 | 2/2009 | Kato et al. |
| 2009/0233424 | A1 | 9/2009 | Ye |
| 2009/0239335 | A1 | 9/2009 | Akimoto et al. |
| 2009/0305461 | A1 | 12/2009 | Akimoto et al. |
| 2010/0078633 | A1 | 4/2010 | Watanabe |
| 2010/0109002 | A1 | 5/2010 | Itagaki et al. |
| 2010/0120197 | A1 | 5/2010 | Levy et al. |

FOREIGN PATENT DOCUMENTS

| | | |
|---|---|---|
| JP | 09-228028 A | 9/1997 |
| JP | 2004-290794 A | 10/2004 |
| KR | 1992006533 | 4/1992 |
| KR | 1999009046 | 3/1999 |
| KR | 2001051193 | 6/2001 |

OTHER PUBLICATIONS

Cao et al. "Low resistivity p-ZnO films fabricated by sol-gel spin coating" Applied Physics Letters 88 251116 (Jun. 2006).

Zhao et al. "Growth of nitrogen-doped p-type ZnO films by spray pyrolysis and their electrical and optical properties". Journal of Crystal Growth 280 (May 2005) 495-501.

Fortunato, et al. "Fully transparent ZnO thin-film transistor produced at room temperature," Advanced Materials, 2005, 17, No. 5, Mar. 8, 2005, Wiley-VCH Verlag GmbH & Co. KGaA, Weinheim, pp. 590-594.

Hirao, et al. "4.1: Distinguished paper: high mobility top-gate zinc oxide thin-film transistors (ZnO-TFTs) for active-matrix liquid crystal displays," SID 06 Digest, ISSN0006-0966X/06/3701-0018-$1.00+.00, 2006, pp. 18-20.

Li, et al. "Progress in semiconducting oxide-based thin-film transistors for displays," Institute of Physics, Semicond. Sci. Technol. 20 (2005), pp. 720-725.

Lu, et al. "P-type ZnO films deposited by DC reactive magnetron sputtering at different ammonia concentrations," Materials Letters 57, Jan. 14, 2003, pp. 3311-3314.

Masuda, et al. "Transparent thin film transistors using ZnO as an active channel layer and their electrical properties," Journal of Applied Physics, vol. 93, No. 3, Feb. 1, 2003, American Institute of Physics, pp. 1624-1630.

Ozgur, et al. "A comprehensive review of ZnO materials and devices," Journal of Applied Physics 98, 041301 (2005), American Institute of Physics.

PCT International Search Report and the Written Opinion dated Oct. 15, 2007 for International Application No. PCT/US07/66166.

Wang, et al. "Epitaxial growth of NH.sub.3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

International Search Report and Written Opinion dated Oct. 8, 2008 for International Application No. PCT/US2008/071890.

Korean Office Action dated Jul. 21, 2008 for Korean Application No. 10-2007-0066962.

Hiramatsu, et al. "Formation of TiN films with low Cl concentration by pulsed plasma chemical vapor deposition," American Vacuum Society, vol. 14, No. 3, May/Jun. 1996, pp. 1037-1040.

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

(56) References Cited

OTHER PUBLICATIONS

Fortunato et al., "Wide-bandgap high-mobility ZnO thin-film transistors produced at room temperature", Applied Physics Letters, vol. 85, No. 13, Sep. 27, 2004, pp. 2541-2543.
Hoffman et al., "ZnO-based transparent thin-film transistors", Applied Physics Letters, vol. 82, No. 5, Feb. 3, 2003, pp. 733-735.
Zong et al., "Optical band gap of zinc nitride films prepared on quartz substrates from a zinc nitride target by reactive rf magnetron sputtering", Applied Surface Science 252 (2006), pp. 7983-7986.
Bian et al., "Deposition and electrical properties of N-In codoped p-type ZnO films by ultrasonic spray pyrolysis", Applied Physics Letters, vol. 84, No. 4, Jan. 26, 2004, pp. 541-543.
Barnes et al., "On the formation and stability of p-type conductivity in nitrogen-doped zinc oxide", Applied Physics Letters, 86, 112112 (2005).
Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.
Hosano et al., "Working hypothesis to explore novel wide band gap electrically conducting amorphous oxides and examples", Journal of Non-Crystalline Solids, 198-200 (1996) pp. 165-169.
Park et al., "Highly Stable $Ga_2O_3$-$In_2O_3$-ZnO Thin-Film Transistors for AM-OLED Application", IDW '07, pp. 1775-1778.
Kwon et al., "4 inch QVGA AMOLED display driven by GaInZnO TFT", IDW '07, pp. 1783-1786.
Perkins et al., "Identification of nitrogen chemical states in N-doped ZnO via x-ray photoelectron spectroscopy", Journal of Applied Physics 97, 034907 (2005).
Yao et al., "Effects of nitrogen doping and illumination on lattice constants and conductivity behavior of zinc oxide grown by magnetron sputtering", Journal of Applied Physics 99, 123510 (2006).
Tu et al., "Nitrogen-doped p-type ZnO films prepared from nitrogen gas radio-frequency magnetron sputtering", Journal of Applied Physics 100, 053705 (2006).
Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.
Lee et al., "42.2: World's Largest (15-inch) XGA AMLCD Panel Using IGZO Oxide TFT", SID 08 Digest, pp. 625-628.
Zong et al., "Structural properties of zinc nitride empty balls", Materials Letters 60 (2006), pp. 905-908.
Nomura et al., "Room-temperature fabrication of transparent flexible thin-film transistors using amorphous oxide semiconductors", Nature, vol. 432, Nov. 25, 2004, pp. 788-492.
Minami, Tadatsugu, "New n-Type Transparent Conducting Oxides", MRS Bulletin, Aug. 2000.
Zong et al., "Synthesis and thermal stability of $Zn_3N_2$ powder", Solid State Communications 132 (2004), pp. 521-525.
Kaminska et al., "Transparent p-type ZnO films obtained by oxidation of sputter-deposited $Zn_3N_2$", Solid State Communications, 135 (2005), pp. 11-15.
Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.
Futushara et al., "Optical properties of zinc oxynitride thin films", Thin Film Solids, 317 (1998), pp. 322-325.
Futushara et al., "Structural, electrical and optical properties of zinc nitride thin films prepared by reactive rf magnetron sputtering", Thin Film Solids, 322 (1998), pp. 274-281.
Carcia et al., "Transparent ZnO thin-film transistor fabricated by rf magnetron sputtering", Applied Physics Letters, col. 82, No. 7, Feb. 17, 2003, pp. 1117-1119.
Yan et al., "Control of Doping by Impurity Chemical Potentials: Predictions for p-type ZnO", Physical Review Letters, vol. 86, No. 25, Jun. 18, 2001, pp. 5723-5726.
Ohya et al., "Thin Film Transistor of ZnO Fabricated by Chemical Solution Deposition", Jpn. J. Appl. Phys., vol. 40 (2001), pp. 297-298.
Hossain, et al., "Modeling and simulation of polycrystalline ZnO thin-film transistors", Journal of Applied Physics, vol. 94, No. 12, Dec. 15, 2003, pp. 7768-7777.
Park et al., "Challenge to Future Displays: Transparent AM-OLED driven by PEALD grown ZnO TFT", IMID '07 Digest, pp. 1249-1252.
Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.
Hirao, et al. "4.1: Distinguished paper: high mobility top-gate zinc oxide thin-film transistors (ZnO-TFTs) for active-matrix liquid crystal displays," SID 06 Digest, ISSN0006-0966X/06/3701-0018-$1.00+.00, 2006 pp. 18-20.
Futsuhara et al. "Optical properties of zinc oxynitride thin films," Thin Solid Films, vol. 317, 1998 Elsevier, pp. 322-325.
International Search Report and Written Opinion dated Aug. 8, 2008 for International Application No. PCT/US08/59638.
Tu et al. "Nitrogen-doped p-type ZnO films prepared from nitrogen gas radio-frequency magnetron sputtering," Journal of Applied Physics, vol. 100, Issue 5, 2006 American Institute of Physics, pp. 053705-053705-4.
Zong et al. "Optical band gap of zinc nitride films prepared on quartz substrates from a zinc nitride target by reactive rf magnetron sputtering," Applied Surface Science, vol. 252, Nov. 22, 2006, pp. 7983-7986.
Son et al., "Threshold Voltage Control of Amorphous Gallium Indium Zinc Oxide TFTs by Suppressing Back-Channel Current" Electrochemical and Solid-State Letters, 12 (1) H26-H28 (2009).
Freeman et al., "Chemical and Thin-Film Strategies for New Transparent Conducting Oxides", MRS Bulletin, Aug. 2000, p. 45-51.
Jin et al., "Optical properties of transparent and heat reflecting ZnO:Al films made by reactive sputtering", Appl. Phys. Lett. 51 (3), Jul. 20, 1987, p. 149-151.
Pei et al., "Optical and electrical properties of direct-current magnetron sputtered ZnO:Al films", Journal of Applied Physics, vol. 90, No. 7, Oct. 1, 2001, p. 3432-3436.
Gordon, "Criteria for Choosing Transparent Conductors", MRS Bulletin, Aug. 2000, p. 52-57.
Ye et al., "High mobility amorphous zinc oxynitride semiconductor material for thin film transistors", Journal of Applied Physics, 106, 074512 (2009).
Chiang et al., "High mobility transparent thin-film transistors with amorphous zinc tin oxide channel layer", Appl. Phys. Lett., 86, 013503 (2005).
Fortunato et al., "Wide-bandgap high-mobility ZnO thin-film transistors produced at room temperature", Applied Physics Letters, vol. 85, No. 13, 2541-2543.
Jackson et al., "High-performance flexible zinc tin oxide field-effect transistors", Applied Physics Letters, 87, 193503 (2005).
First Office Action for Chinese Patent Application No. 200880015621.X dated Nov. 24, 2010.
Wang et al., "Fabrication and characteristics of the low-resistive p-type ZnO thin films by DC reactive magnetron sputtering", Materials Letters, vol. 60, p. 912-914, Dec. 31, 2006.
Wang, "The optical and electrical characteristics and the microstructure of Al doped zinc oxide thin films", Dept. of Information material science and engineering Guilin, vol. 25(02), p. 19-22, Apr. 20, 2005.
Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.
Office action dated Feb. 19, 2013 for Japanese Patent Application No. 2010-506380.
Office action for Taiwan Patent Application No. 97113850 dated Jun. 19, 2013.
Korean office action for Korean Patent Application No. 10-2011-7023082 dated Jul. 1, 2013.

* cited by examiner

THIN FILM SEMICONDUCTOR MATERIAL PRODUCED THROUGH REACTIVE SPUTTERING OF ZINC TARGET USING NITROGEN GASES

CROSS-REFERENCE TO RELATED APPLICATIONS

This application is a continuation of co-pending U.S. patent application Ser. No. 13/074,783 (APPM/11924.D1), filed Mar. 29, 2011, which application is a divisional of U.S. patent application Ser. No. 11/829,037 (APPM/11924), filed Jul. 26, 2007 and issued as U.S. Pat. No. 7,927,713, which claims benefit of U.S. Provisional Patent Application Ser. No. 60/914,582 (APPM/11924L), filed Apr. 27, 2007, each of which is herein incorporated by reference.

BACKGROUND OF THE INVENTION

1. Field of the Invention

Embodiments of the present invention generally relate to a high mobility thin film semiconductor material produced through reactive sputtering of a zinc sputtering target using nitrogen containing gases under both low and high temperature conditions.

2. Description of the Related Art

The electron mobility of a semiconductor layer has a very strong effect on the speed of the device and the current which may be driven through the device. The higher the electron mobility, the faster the speed of the device and the higher the source-drain current under the same voltage. In recent years, amorphous silicon and polysilicon have been the semiconductor layers of choice for field effect thin film transistors (TFTs), for backplane to drive liquid crystal displays (LCDs), organic light emitting diode (OLED) displays, and quantum dot displays, and to build solar cell panels. Amorphous silicon may have an electron mobility as high as about 1 $cm^2/V\text{-}s$. Low temperature polysilicon may have an electron mobility higher than 50 $cm^2/V\text{-}s$, but requires a complicated process step such as laser annealing to achieve the electron mobility. Therefore, the cost of producing polysilicon with an electron mobility higher than 50 $cm^2/V\text{-}s$ is very high and not suitable for large area substrate applications.

In a field effect transistor (FET), the semiconductor material creates the channel between the source and drain electrodes. Without a voltage supply to the gate electrode, no current may go through the source-drain electrode even with a voltage between the source-drain electrodes. As voltage is supplied to the gate electrode, mobile electrons inside the semiconductor layer will accumulate in the area very close to the interface between the gate dielectric layer and the semiconductor layer. The semiconductor layer becomes conductive, and electrodes may go through the source-drain electrode easily with a low voltage between the source-drain electrodes. High mobility of the semiconductor materials indicates the mobile electrons in the semiconductor are more sensitive to the electric field created by the gate electrode, and the semiconductor channel becomes more conductive. The semiconductor material determines the current which may go through the semiconductor channel influenced by voltage applied across the gate and source terminals. The greater the mobility of the semiconductor material, the less voltage is needed to achieve the current required across the FET.

Amorphous silicon may rely upon hydrogen passivation to achieve a desired mobility in a TFT. The amorphous silicon may be deposited by chemical vapor deposition (CVD) at temperatures up to about 350 degrees Celsius. The hydrogen passivation, while helping the amorphous silicon achieve the desired mobility, may not be stable such as TFT's threshold voltage to change with time under gate electrode voltage and under relatively high temperatures created by the device itself.

Therefore, there is a need in the art for a stable semiconductor material having sufficiently high mobility not only on glass substrates with high process temperatures, but also on plastic substrates and other flexible substrates.

SUMMARY OF THE INVENTION

The present invention generally comprises a semiconductor film and a reactive sputtering process used to deposit the semiconductor film. The sputtering target may comprise zinc, which may be doped with aluminum or other metals. The zinc target may be reactively sputtered by introducing a nitrogen containing gas and an oxygen containing gas to the chamber. The amount of nitrogen containing gas may be determined by a film structure which does not have the typical zinc oxide signature peaks such as a zinc oxide (002) peak as measured by XRD. The nitrogen containing gas flow may be selected so that the film is amorphous (i.e., no clear peaks as measured by XRD) or with some weak peak of zinc nitride or zinc oxynitride. The nitrogen containing gas flow may be significantly greater than the oxygen containing gas flow. The amount of oxygen containing gas may be based upon a turning point of the film structure. The amount of oxygen containing gas may be selected to be less than the amount necessary to produce a zinc oxide (002) peak as measured by XRD. In order to simplify the process, the oxygen containing gas flow may also be determined through the film transmittance, a DC voltage change, or the film conductivity based upon measurements obtained from deposition without the nitrogen containing gas since they are related to the film structure. The film created may be adjusted to amorphous or crystalline structure in certain levels. The reactive sputtering may occur at temperatures from about room temperature up to several hundred degrees Celsius. After deposition, the semiconductor film may be annealed to further improve the film mobility.

The film may have no clear zinc oxide peaks as measured by XRD, although an oxygen content of the film may be 25 percent of more. In one embodiment, the film may have no peaks of $Zn_3N_2$. In another embodiment, one or more peaks of $Zn_3N_2$ may be present as measured by XRD. The film may comprise zinc, oxygen, nitrogen, and other metallic species doped into the film such as aluminum. The film may have nitride or nitrite bonding as measured by XPS. The film may have an optical absorption edge between about 400 nm to about 1,000 nm and a band gap of about 3.1 eV to about 1.2 eV. Since the semiconductor film is produced based upon the film structure, the semiconductor film may be produced under different process temperatures, different powers, and even using different product platforms.

In one embodiment, a sputtering method is disclosed. The method comprises disposing a zinc target in a sputtering chamber, flowing a sputtering gas into the chamber, the sputtering gas comprising an oxygen containing gas and a nitrogen containing gas, applying a bias to the target, and depositing a semiconductor layer on a substrate, the semiconductor layer comprising the zinc, oxygen, and nitrogen.

In another embodiment, a sputtering method is disclosed. The method comprises flowing a nitrogen containing gas and an oxygen containing gas into a sputtering chamber, the chamber having a metal target comprising zinc and sputter depositing a semiconductor layer onto the substrate, the semiconductor layer comprising zinc, oxygen, and nitrogen.

In another embodiment, a semiconductor film, comprising zinc, oxygen, and nitrogen is disclosed. In another embodiment, a semiconductor film comprising zinc and having a mobility of greater than about 5 $cm^2/V\text{-s}$ is disclosed. In another embodiment, a semiconductor film, when measured using x-ray diffraction, having a first peak of $Zn_3N_2$ at 2 theta and about 31.5 degree having a possible (222) orientation and a second peak of $Zn_3N_2$ at 2 theta and about 39 degrees having a possible (411) orientation is disclosed. Other $Zn_3N_2$ peaks such as at 2 theta and about 36.7 degrees having a possible (400) orientation could also be observed as shown in FIG. 3F.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a semiconductor film and the reactive sputtering process used to deposit the semiconductor film. The sputtering target may comprise zinc. In one embodiment, the target may comprise zinc with a purity of 99.990 atomic percent or greater, preferably 99.995 atomic percent or greater. In another embodiment, the target comprises zinc doped with one or more doping metals. For example, the target may comprise zinc doped with between about 1 atomic percent to about 20 atomic percent aluminum. The zinc target may be reactively sputtered by introducing a nitrogen containing gas, an oxygen containing gas, and argon to the chamber. The amount of nitrogen containing gas may be significantly greater than the amount of oxygen containing gas and the amount of argon gas. The amount of oxygen containing gas may be based upon a turning point of the film structure, the film transmittance, a DC voltage change, or the film conductivity based upon measurements obtained from deposition without the nitrogen containing gas. The reactive sputtering may occur at substrate temperatures from about room temperature up to several hundred degrees Celsius. After deposition, the semiconductor film may be annealed to further improve the film mobility. It is to be understood that while description below may describe the target bias as DC, AC bias may be used as well.

The reactive sputtering method is illustratively described and may be practiced in a PVD chamber for processing large area substrates, such as a 4300 PVD chamber, available from AKT, a subsidiary of Applied Materials, Inc., Santa Clara, Calif. However, because the semiconductor film produced according to the method may be determined by the film structure and composition, it should be understood that the reactive sputtering method may have utility in other system configurations, including those systems configured to process large area round substrates and those systems produced by other manufacturers, including roll-to-roll process platforms. It is to be understood that while the invention is illustratively described below as deposited by PVD, other methods including chemical vapor deposition (CVD), atomic layer deposition (ALD), or spin-on processes may be utilized to deposit the inventive films.

Figure 1:
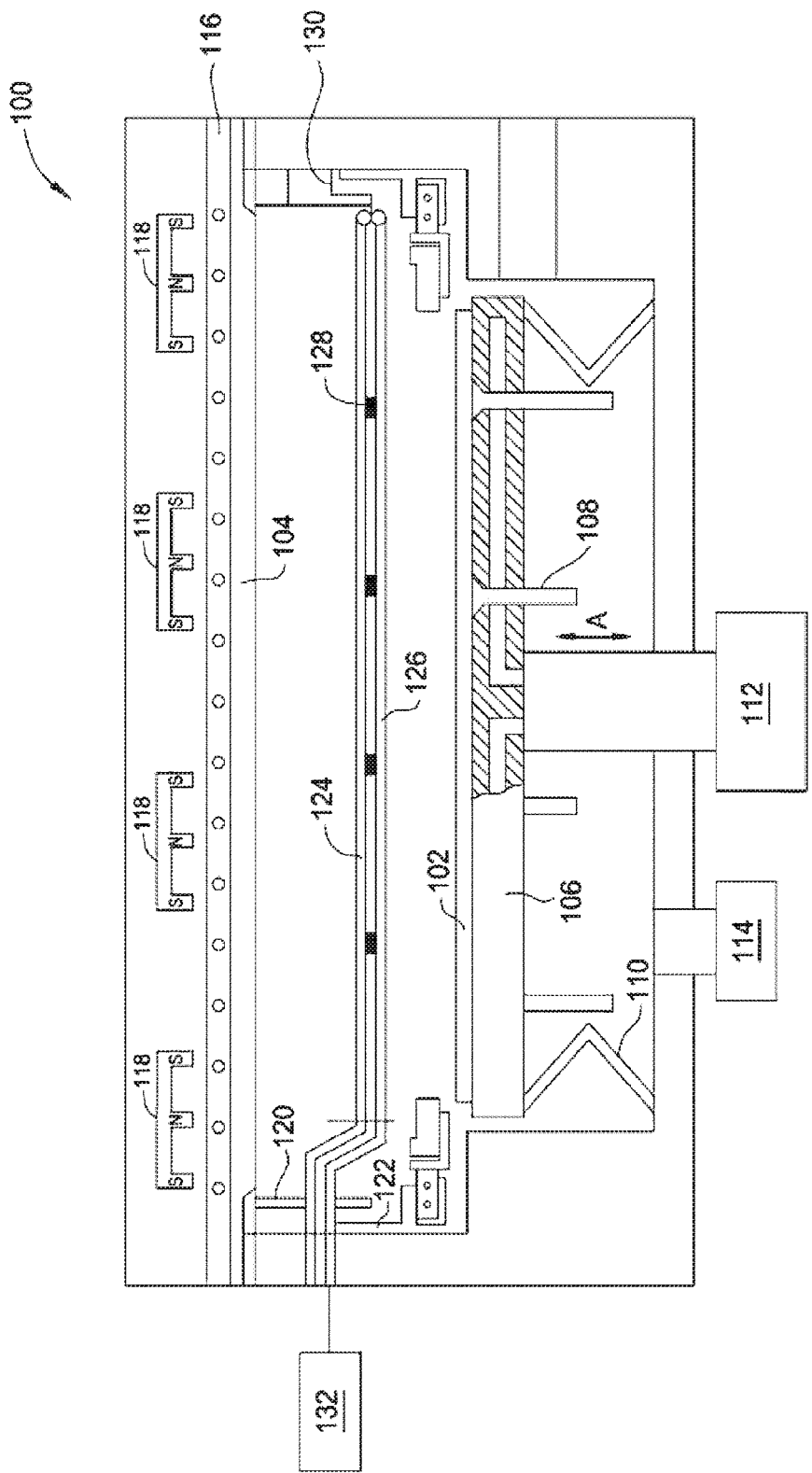
FIG. 1 is a schematic cross sectional view of a sputtering chamber that may be used to deposit the semiconductor film according to one embodiment of the invention.

FIG. 1 is a cross-sectional schematic view of a PVD chamber 100 according to one embodiment of the invention. The chamber 100 may be evacuated by a vacuum pump 114. Within the chamber 100, a substrate 102 may be disposed opposite a target 104. The substrate may be disposed on a susceptor 106 within the chamber 100. The susceptor 106 may be elevated and lowered as shown by arrows "A" by an actuator 112. The susceptor 106 may be elevated to raise the substrate 102 to a processing position and lowered so that the substrate 102 may be removed from the chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition.

The target 104 may comprise one or more targets 104. In one embodiment, the target 104 may comprise a large area sputtering target 104. In another embodiment, the target 104 may comprise a plurality of tiles. In yet another embodiment, the target 104 may comprise a plurality of target strips. In still another embodiment, the target 104 may comprise one or more cylindrical, rotary targets. The target 104 may be bonded to a backing plate 116 by a bonding layer (not shown). One or more magnetrons 118 may be disposed behind the backing plate 116. The magnetrons 118 may scan across the backing plate 116 in a linear movement or in a two dimensional path. The walls of the chamber may be shielded from deposition by a dark space shield 120 and a chamber shield 122.

To help provide uniform sputtering deposition across a substrate 102, an anode 124 may be placed between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so that charged ions will be attracted thereto rather than to the chamber walls which are typically at ground potential. By providing the anode 124 between the target 104 and the substrate 102, the plasma may be more uniform, which may aid in the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

For reactive sputtering, it may be beneficial to provide a reactive gas into the chamber 100. One or more gas introduction tubes 126 may also span the distance across the chamber 100 between the target 104 and the substrate 102. For smaller substrates and hence, smaller chambers, the gas introduction tubes 126 spanning the processing space may not be necessary as an even gas distribution may be possible through conventional gas introduction means. The gas introduction tubes 126 may introduce sputtering gases from a gas panel 132. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so that the gas introduction tubes 126 are grounded and function as anodes.

The reactive sputtering process may comprise disposing a zinc sputtering target opposite a substrate in a sputtering chamber. The zinc sputtering target may substantially comprise zinc or zinc and a doping element. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. The substrate, on the other hand, may comprise plastic, paper, polymer, glass, stainless steel, and combinations thereof. When the substrate is plastic, the reactive sputtering may occur at temperatures below about 180 degrees Celsius.

During the sputtering process, argon, a nitrogen containing gas, and an oxygen containing gas may be provided to the chamber for reactive sputtering the zinc target. Additional additives such as $B_2H_6$, $CO_2$, CO, $CH_4$, and combinations thereof may also be provided to the chamber during the sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the zinc from the sputtering target to form a semiconductor material comprising zinc, oxygen, and nitrogen on the substrate.

In order to determine the desired oxygen flow rate for forming the semiconductor film, the amount of oxygen may be selected so that the amount of oxygen is not sufficient to completely oxidize the zinc to form zinc oxide. The amount of oxidation of zinc may affect the transmittance. For example, completely oxidized zinc may have a transmittance of greater than about 80 percent. One manner of determining the desired oxygen flow is to run a reactive sputtering process using argon and oxygen gases without using nitrogen gas. Experiments may be performed at different oxygen flow rates and the optical transmittance in the visible wavelength may be measured. The desired oxygen flow may be just before the film has a maximum transparency that may be achieved. Table I shows the optical transmittance for zinc oxide reactively sputter deposited at various oxygen flow rates. In one embodiment, the maximum preferred transmittance may be 80 percent. In other embodiments, the maximum transmittance may not be 80 percent if the glass absorption or light interference is included. The experiments may be useful when using different DC target power, different substrate temperature, or even different oxygen containing gases such as $N_2O$.

TABLE I

| Oxygen Flow Rate (sccm/m³) | Transmittance (%) |
|---|---|
| 0 | <5 |
| 50 | <5 |
| 100 | <5 |
| 125 | 82 |

TABLE I-continued

| Oxygen Flow Rate (sccm/m³) | Transmittance (%) |
|---|---|
| 150 | 85 |
| 200 | 90 |

Another method to determine the desired oxygen gas flow is to perform the reactive sputtering to form zinc oxide under the condition of providing no nitrogen or a low amount of nitrogen as discussed above and then measure the sheet resistance. An oxygen flow rate that produces a sheet resistance between about 100 ohm/sq and $1.0 \times 10^7$ ohm/sq may be the desired oxygen flow rate.

Yet another manner for determining the desired oxygen flow rate is to take an XRD film structure measurement. FIGS. 2A-2E are XRD graphs for films showing the formation of zinc and zinc oxide peaks as a function of oxygen gas flow. Each of the films shown in FIGS. 2A-2E were deposited at an argon flow rate of 600 sccm/m³ and 1,000 W and various oxygen flow rates.

Figure 2A:
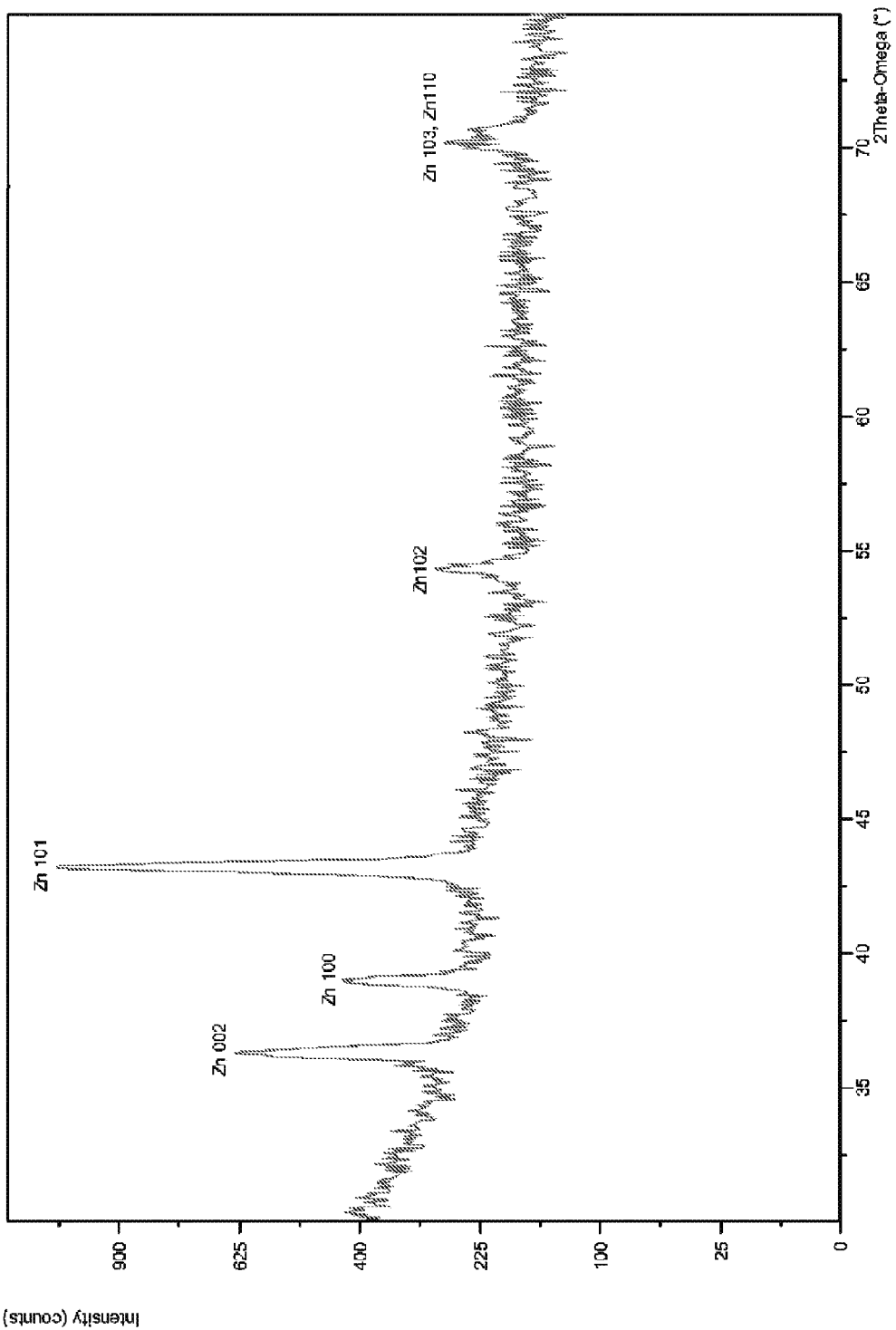
FIGS. 2A-2E are XRD graphs for films showing the formation of zinc and zinc oxide peaks as a function of oxygen gas flow.

FIG. 2A shows an XRD graph of a film formed when no oxygen gas is provided during the sputtering. Several zinc peaks were produced having various intensities. A zinc (002) peak is shown for 2 theta (i.e., the angle between the incident x-ray and the detector of the diffractometer) between about 35.5 and 37 with an intensity of about 625 counts. A zinc (100) peak is shown between about 38 and 40 with an intensity of about 450 counts. A zinc (101) peak is shown between about 42.5 and 44 with an intensity of about 1050 counts. A zinc (102) peak is shown between about 53 and 55 with an intensity of about 325 counts. A zinc (103) peak is shown between about 69.5 and 70 with an intensity of about 300. A zinc peak (110) peak is shown between about 70 and 71 with an intensity of about 275 counts. The ratio of peak heights for the zinc (002): zinc (100): zinc (101): zinc (102): zinc (103): zinc (110) is about 2.27:1.64:3.82:1.182:1.091:1. All peaks are marked using the International Center for Diffraction Data (ICDD) PDF2 database (rev. 2004) for phase identification.

Figure 2B:
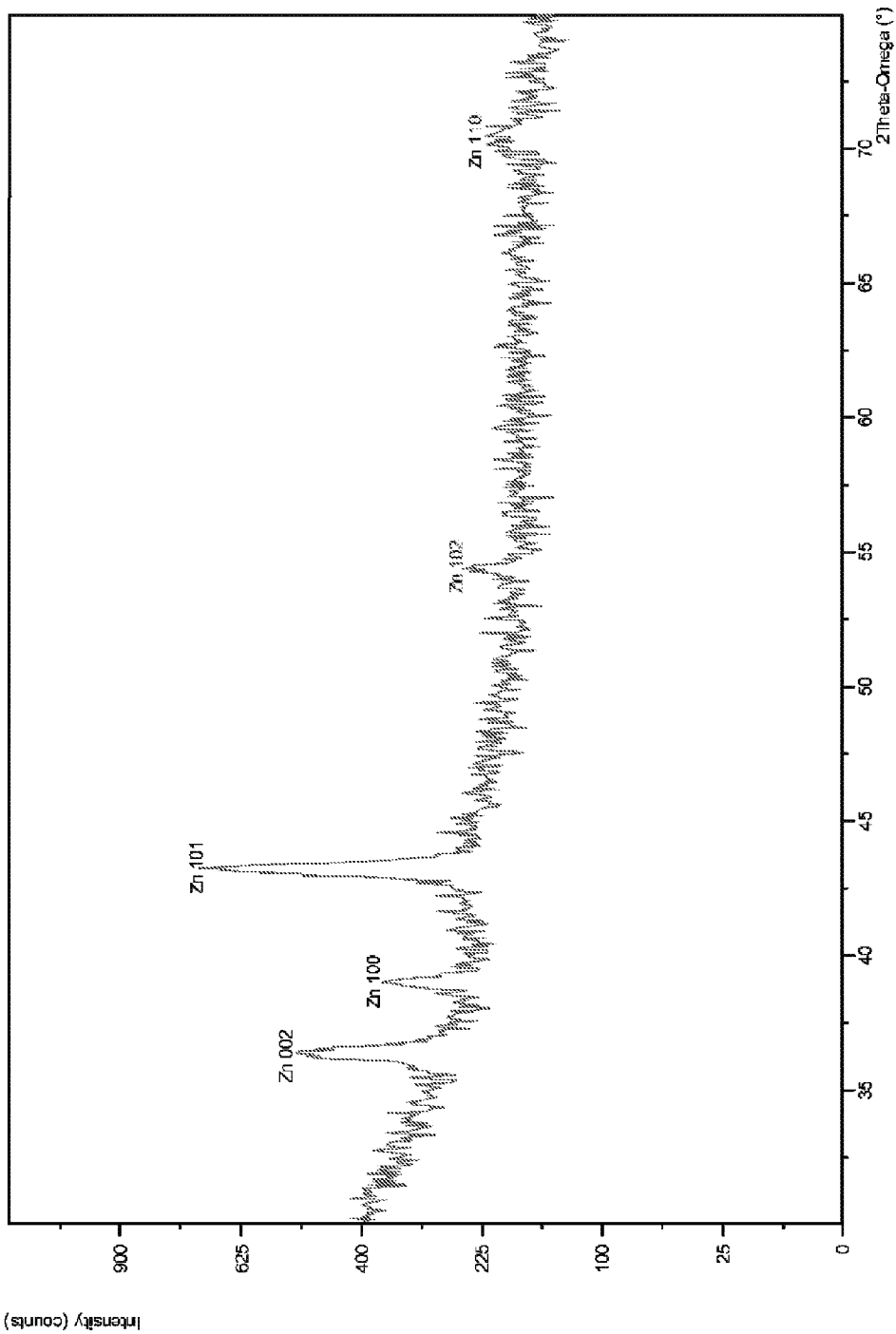

When oxygen gas is provided at a flow rate of 50 sccm/m³, the zinc peaks diminish in intensity as shown in FIG. 2B. The zinc (002) peak diminishes to about 500 counts. The zinc (100) peak diminishes to about 375 counts. The zinc (101) peak diminishes to about 750 counts. The zinc (102) peak diminishes to about 250 counts. The zinc (110) peak diminishes to about 225 counts, and the zinc (103) peak is not present. The ratio of the peak heights for zinc (002): zinc (100): zinc (101): zinc (102): zinc (110) is about 2.22:1.67:3.33:1.11:1.

Figure 2C:
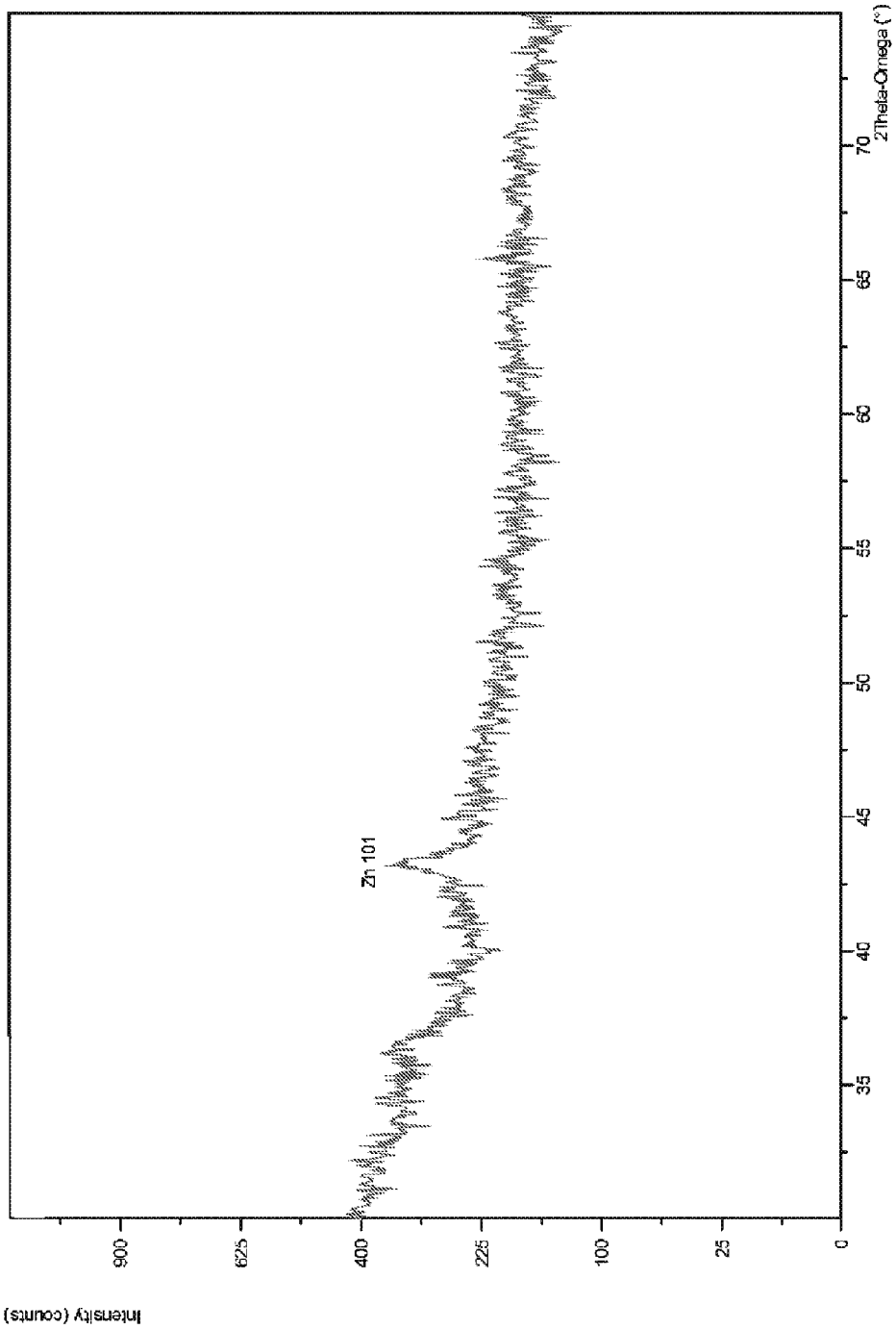
Figure 2D:
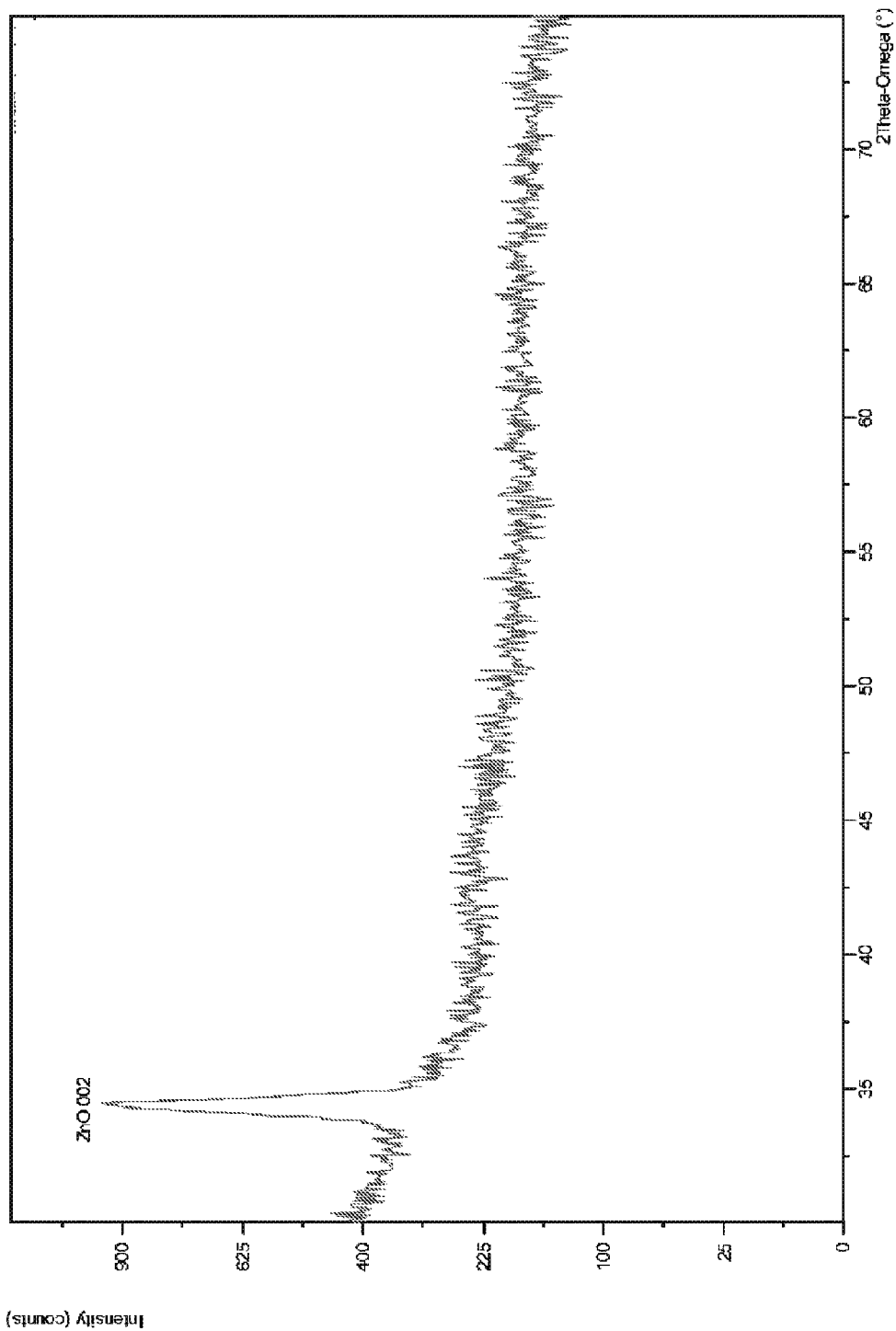
Figure 2E:
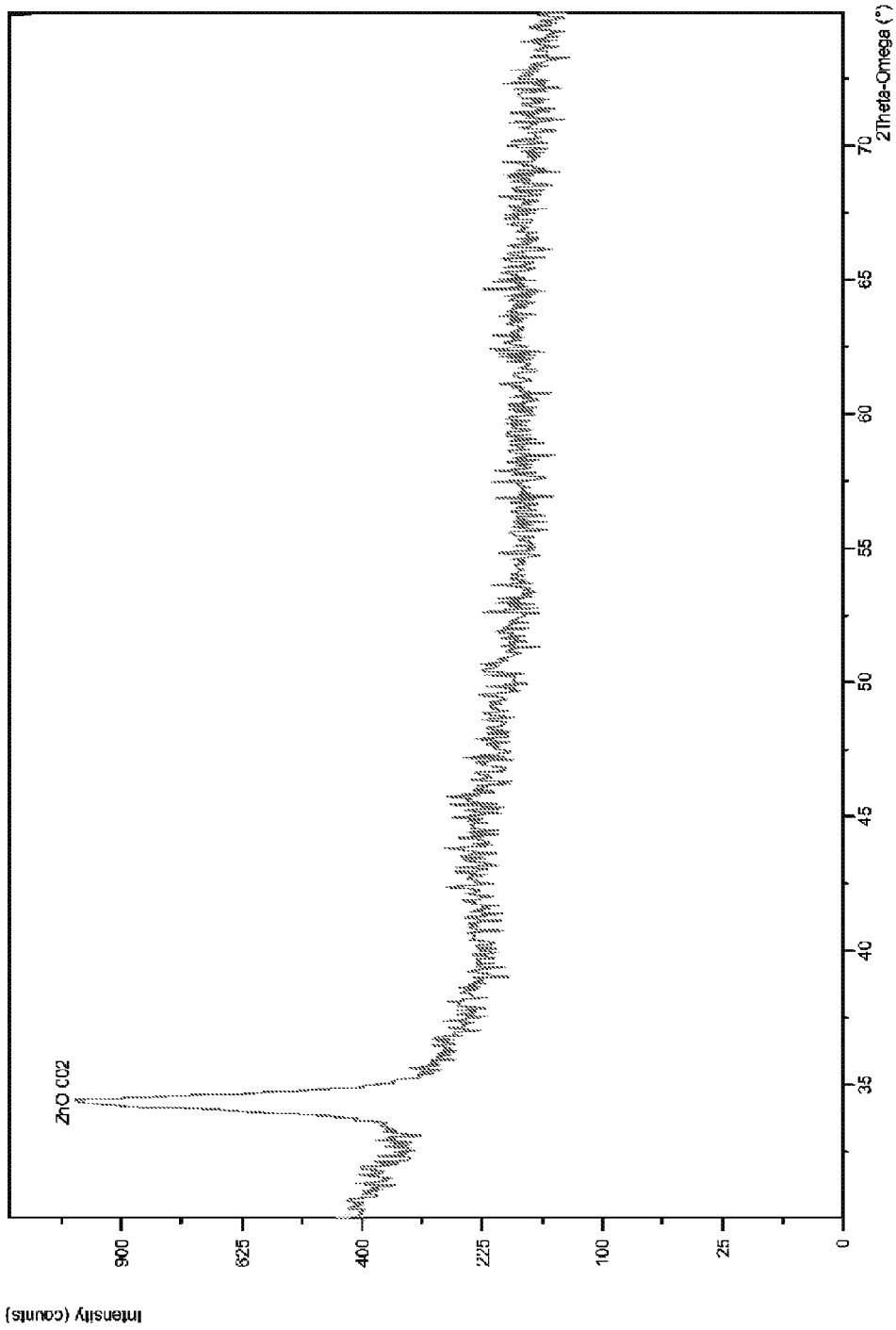

When the oxygen gas is provided at a flow rate of 100 sccm/m³, all of the zinc peaks disappear except the zinc (101) peak which has diminished to about 375 counts as shown in FIG. 2C. When the oxygen gas is provided at 150 sccm/m³, the zinc peaks are completely gone, but a zinc oxide (002) peak appears between about 33.5 and 35 with an intensity of about 950 counts as shown in FIG. 2D. When the oxygen flow rate is increased to 200 sccm/m³, the zinc oxide (002) peak increases in intensity to about 1,000 counts as shown in FIG. 2E.

The amount of oxygen supplied, according to the XRD data, should be less than about 150 sccm/m³ because at 150 sccm/m³ a strong zinc oxide peak appears. It is to be understood that the flow rate of oxygen is proportional to the chamber size. Thus, for as the size of the chamber increases, the oxygen flow rate may also increase. Similarly, as the size of the chamber is reduced, the oxygen flow rate may decrease.

To determine the desired nitrogen flow rate, XRD film structure measurements may be taken. FIGS. 3A-3F are XRD graphs for showing the formation of a semiconductor film according at various nitrogen gas flow rates according to one embodiment of the invention. Each of the films shown in FIGS. 3A-3F were deposited at an argon flow rate of 600 sccm/m$^3$, 2,000 W, an oxygen flow rate of 100 sccm/m$^3$, and various nitrogen flow rates.

Figure 3A:
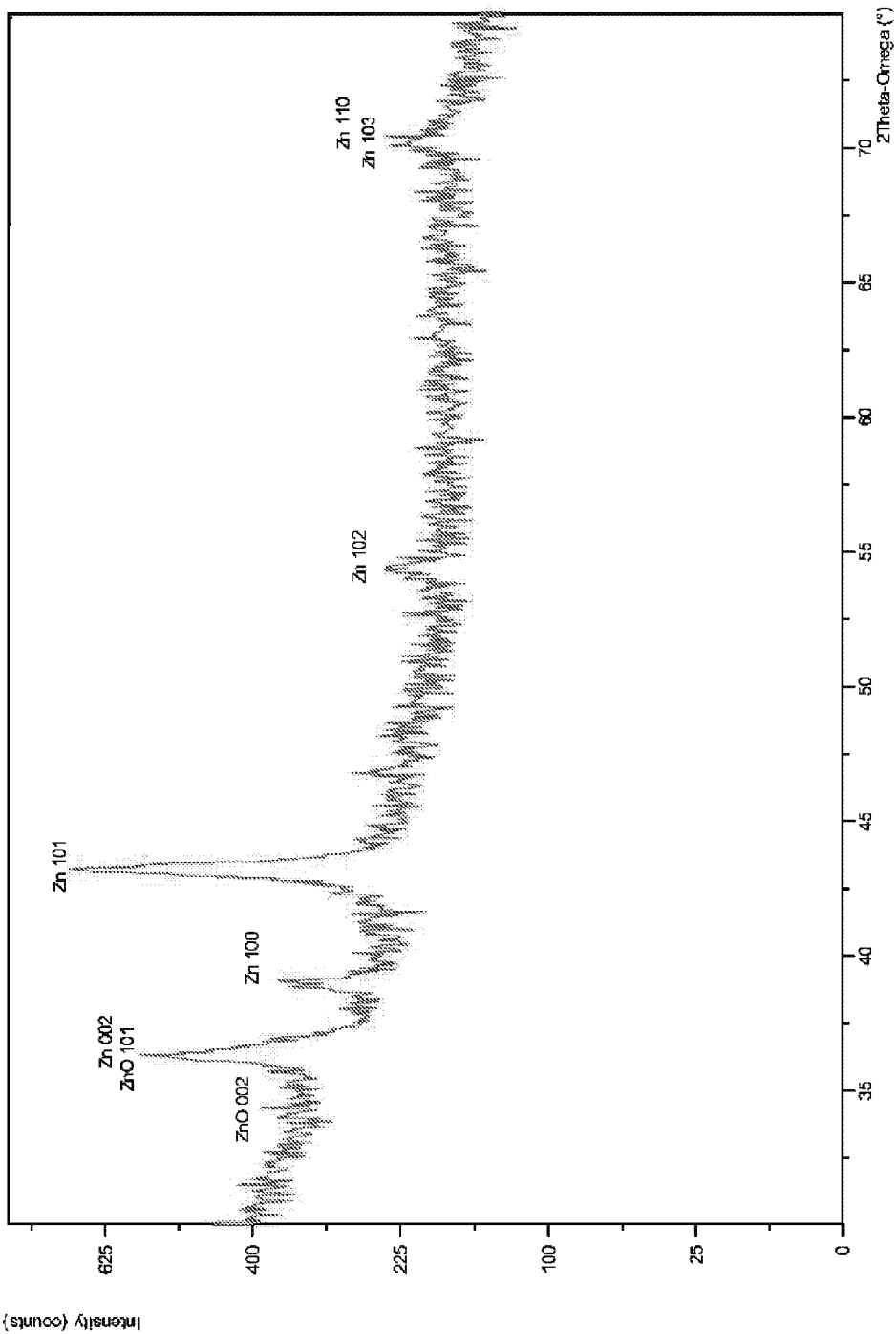
FIGS. 3A-3F are XRD graphs for showing the formation of a semiconductor film according at various nitrogen gas flow rates according to one embodiment of the invention.

FIG. 3A shows an XRD graph of a film deposited with no nitrogen. The graph reveals several strong peaks including a peak between about 35 and about 37 of zinc oxide (101) and zinc (002) having an intensity of about 575 counts, a peak between about 38 and 40 of zinc (100) having an intensity of about 380 counts, and a peak between about 42.5 and 44 of zinc (101) having an intensity of about 700 counts. Smaller peaks of zinc oxide (002) between about 35.5 and 37 with an intensity of about 390 counts, zinc (102) between about 53 and 55 with an intensity of about 275 counts, zinc (103) between about 69.5 and 70 with an intensity of about 225 counts, and a peak of zinc (110) between about 70 and 71 with an intensity of about 225 counts are also present. The ratio of the peak heights for zinc oxide (101): zinc (002): zinc (100): zinc (101): zinc oxide (002): zinc (102): zinc (103): zinc (110) is about 2.55:2.55:1.24:3.11:1.73:1.22:1:1.

Figure 3B:
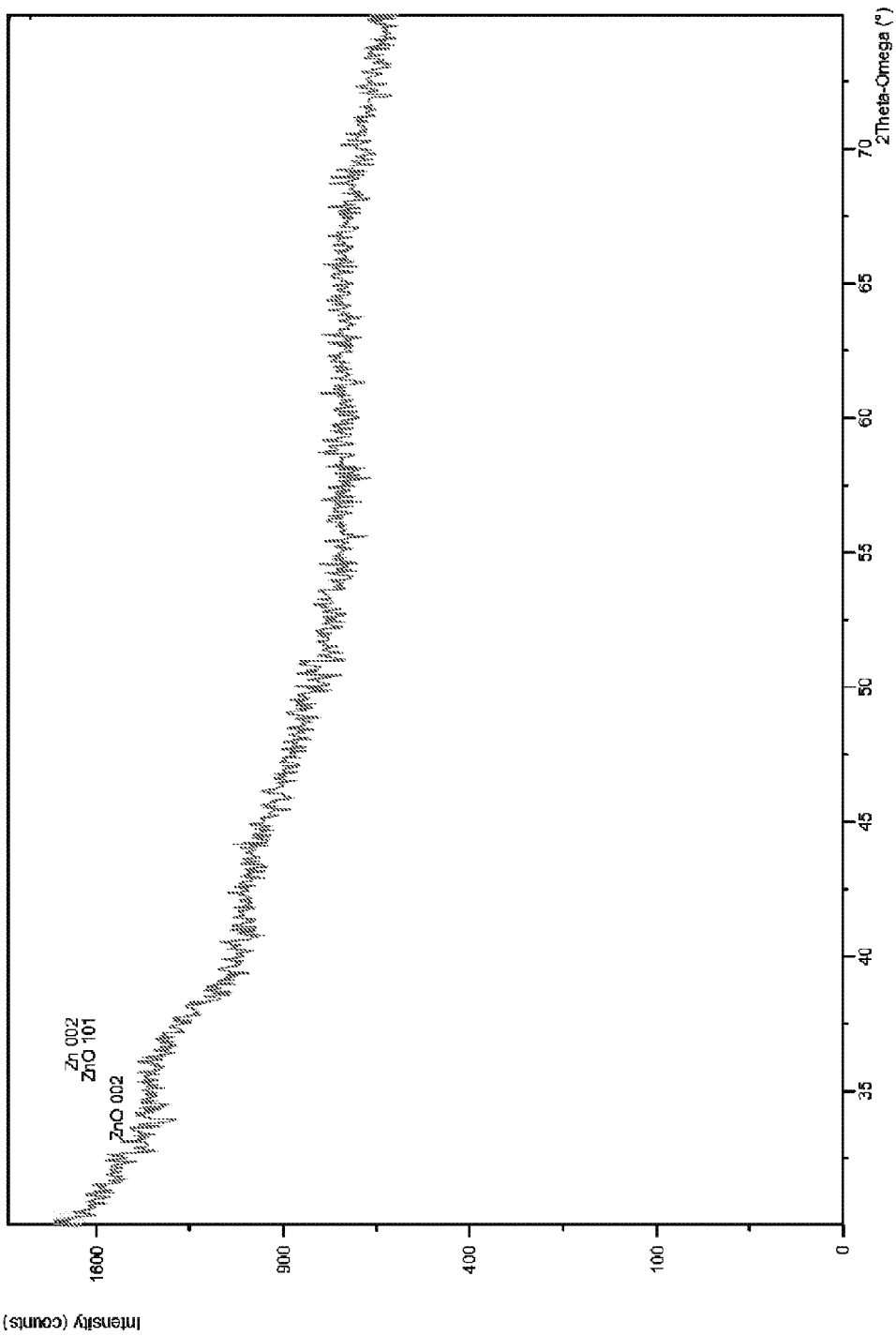
Figure 3C:
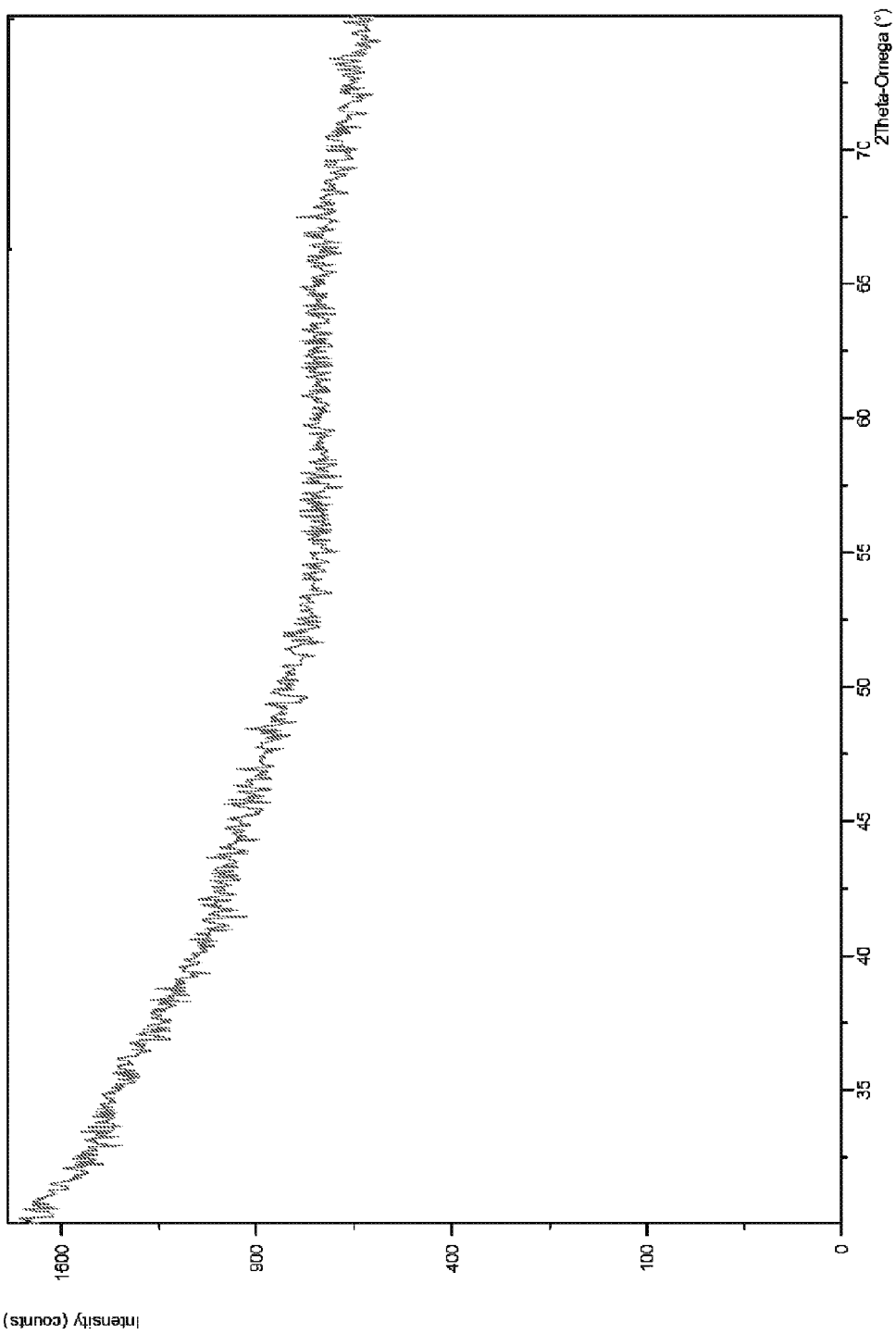

When nitrogen is provided during the reactive sputtering at a flow rate of 300 sccm/m$^3$, the zinc the zinc oxide peaks have significantly diminished to the point where zinc oxide may no longer be present as shown in FIG. 3B. When the nitrogen flow rate is increased to 500 sccm/m$^3$, all of the zinc and zinc oxide peaks have diminished and the film has an amorphous structure as shown in FIG. 3C.

Figure 3D:
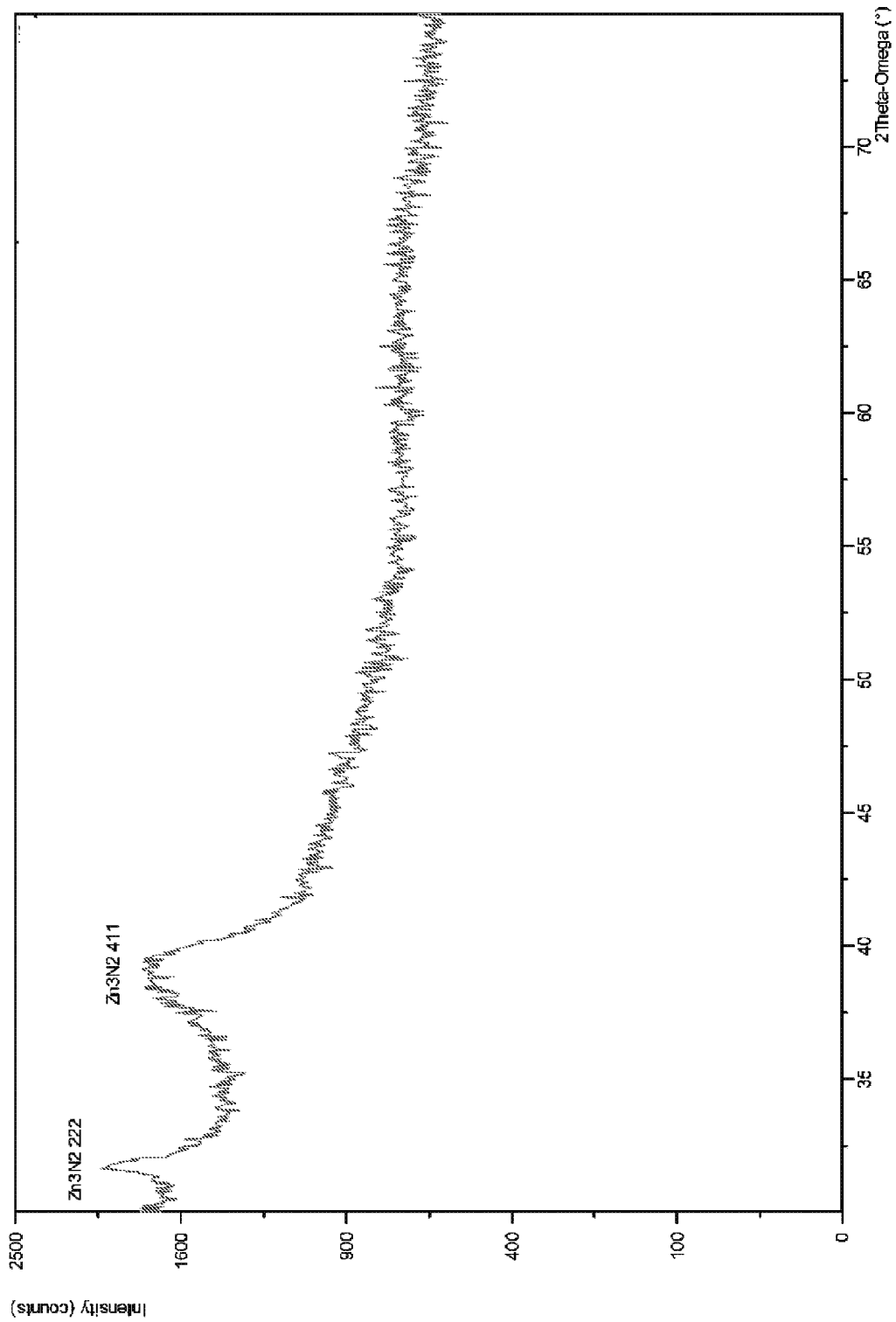
Figure 3E:
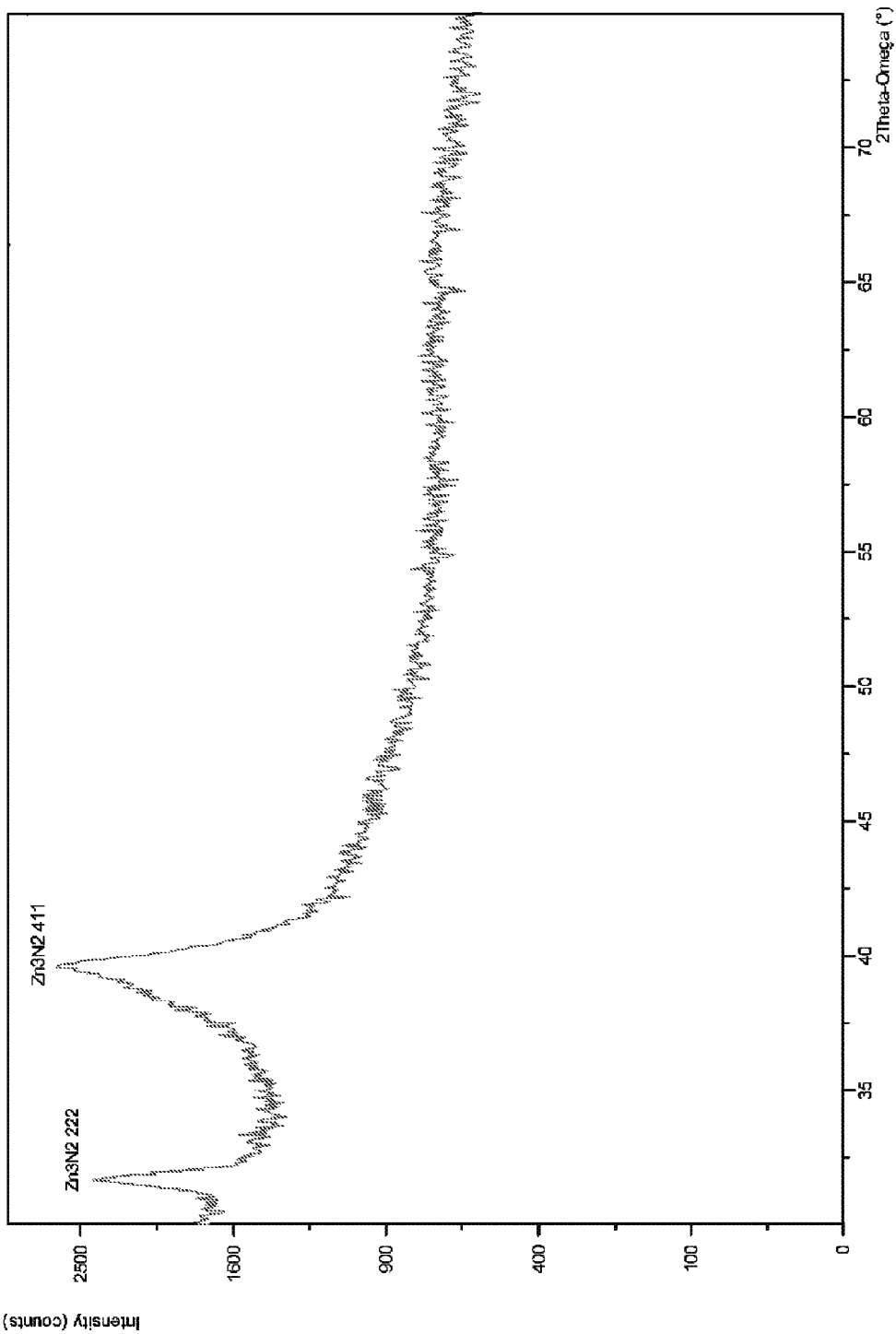
Figure 3F:
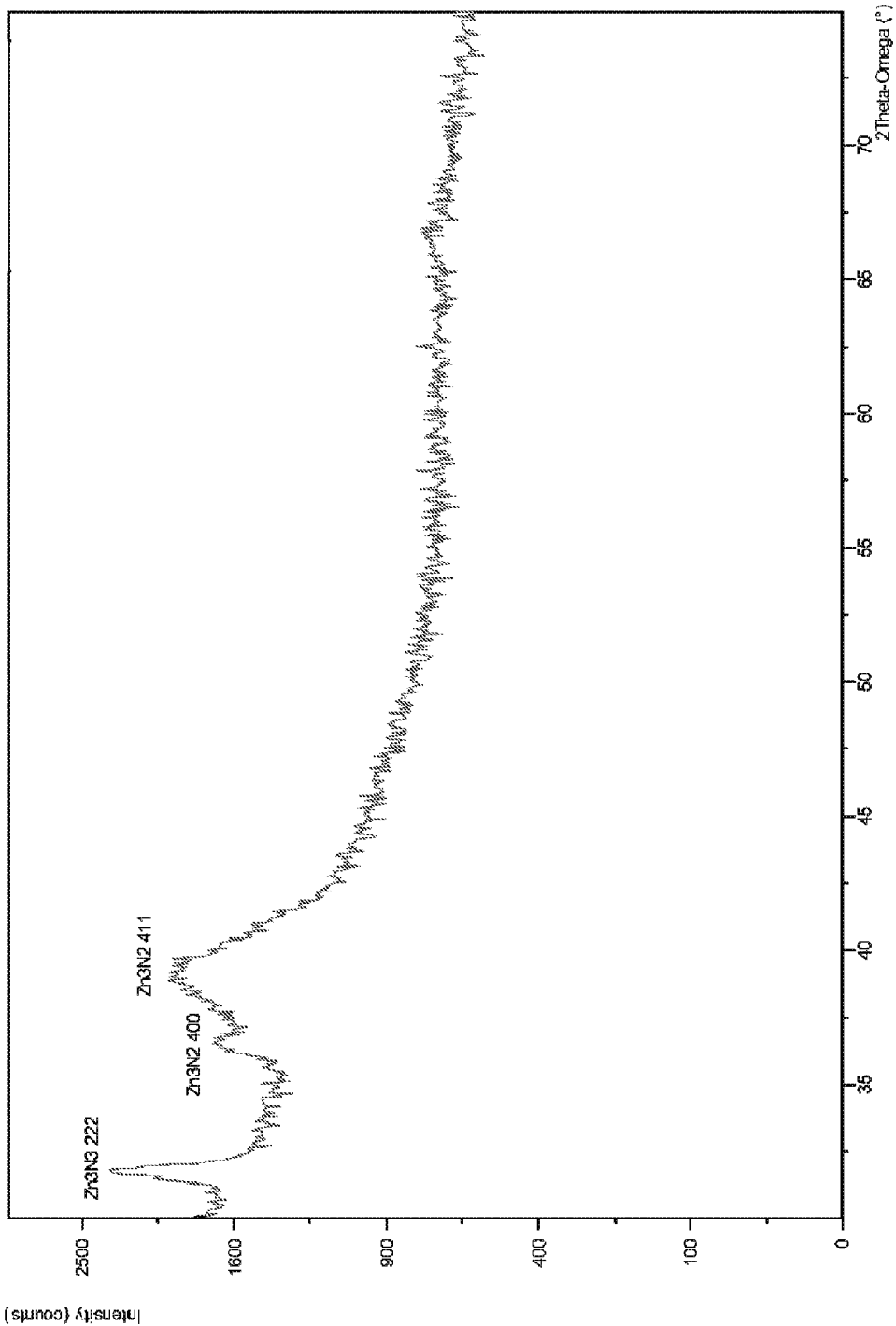

When the nitrogen flow rate is increased to 1,000 sccm/m$^3$, two new peaks appear as shown in FIG. 3D. A first peak of $Zn_3N_2$ (222) has formed between about 31 and 33 with an intensity of about 2050 counts. A second peak of $Zn_3N_2$ (411) has formed between about 35 and 42 with an intensity of about 1850 counts. The ratio of peak heights for $Zn_3N_2$ (222): $Zn_3N_2$ (411) is about 1.11:1. When the nitrogen gas flow rate is increased to 1,250 sccm/m$^3$, the $Zn_3N_2$ (222) peak intensifies to about 2500 counts and the $Zn_3N_2$ (411) peak intensifies to about 2600 counts as shown in FIG. 3E. The ratio of peak heights for $Zn_3N_2$ (222): $Zn_3N_2$ (411) is about 0.96:1. When the nitrogen flow rate is increased to 2,500 sccm/m$^3$, the $Zn_3N_2$ (222) peak and the $Zn_3N_2$ (411) weaken to about 2350 and 2050 respectively, but a new peak of $Zn_3N_2$ (400) develops between about 36 and 37.5 with an intensity of about 1700 counts as shown in FIG. 3F. The ratio of peak heights for $Zn_3N_2$ (222): $Zn_3N_2$ (411): $Zn_3N_2$ (400) is about 1.38:1.21:1.

The amount of nitrogen supplied, according to the XRD data, should be greater less than about 300 sccm/m$^3$ because at 300 sccm/m$^3$ the zinc oxide peaks diminish significantly such that essentially no zinc oxide is present in the film. It is to be understood that the flow rate of nitrogen is proportional to the chamber size. Thus, for as the size of the chamber increases, the nitrogen flow rate may also increase. Similarly, as the size of the chamber is reduced, the nitrogen flow rate may decrease.

Therefore, combining the oxygen flow rates from above and the nitrogen flow rates from above, the new semiconductor film discussed herein may be deposited under a nitrogen to oxygen flow rate ratio of greater than about 2:1. In one embodiment, the flow ratio of nitrogen to oxygen may be 10:1 to about 50:1. In still another embodiment, the flow ratio of nitrogen to oxygen may be 20:1.

To produce the semiconductor material, the flow rate of the nitrogen containing gas may be much greater than the flow rate of the oxygen containing gas as discussed above. The deposited semiconductor material may have a mobility greater than amorphous silicon. Table II shows the mobility as a function of nitrogen gas flow rate according to one embodiment of the invention.

TABLE II

| Nitrogen Flow Rate (sccm/m$^3$) | Oxygen Flow Rate (sccm/m$^3$) | Mobility (cm$^2$/V-s) |
|---|---|---|
| 500 | 50 | 1 |
|  | 100 | 13.5 |
|  | 250 | 5 |
| 1,000 | 50 | 14 |
|  | 100 | 27 |
| 1,500 | 0 | <1 |
|  | 25 | 8 |
|  | 50 | 31 |
|  | 150 | 23.5 |
|  | 200 | 1 |
|  | 250 | 2 |
| 2,000 | 0 | 1 |
|  | 50 | 34 |
|  | 100 | 29 |
| 2,500 | 0 | 2.5 |
|  | 25 | 15 |
|  | 50 | 33.5 |
|  | 100 | 33 |
|  | 150 | 25 |
|  | 200 | 10 |
|  | 250 | 12 |

Films deposited under conditions of 0 sccm oxygen had mobility of less than 5 cm$^2$/V-s for all flow rates of nitrogen gas. Films deposited under conditions of 25 sccm/m$^3$ oxygen had a mobility of about 8 cm$^2$/V-s for a nitrogen flow rate of 1,500 sccm/m$^3$ and about 15 cm$^2$/V-s for a nitrogen flow rate of 2,500 sccm/m$^3$. Films deposited under conditions of 200 sccm/m$^3$ oxygen had a mobility of about 1 cm$^2$/V-s for a nitrogen flow rate of 1,500 sccm/m$^3$ and a mobility of about 10 cm$^2$/V-s for a nitrogen flow rate of 2,500 sccm/m$^3$. Films deposited under conditions of 250 sccm/m$^3$ oxygen has a mobility of about 5 cm$^2$/V-s for a nitrogen flow rate of 500 sccm/m$^3$, about 2 cm$^2$/V-s for a nitrogen flow rate of 1,500 sccm/m$^3$, and about 12 cm$^2$/V-s for a nitrogen flow rate of 2,500 sccm/m$^3$.

For films deposited with an oxygen flow rate of between 50 sccm/m$^3$ and 150 sccm/m$^3$, the mobility of the films was markedly increased over the films deposited at oxygen flow rates of 25 sccm/m$^3$ and below and films deposited at oxygen flow rates of 200 sccm/m$^3$ and above. Additionally, the films deposited with an oxygen flow rate of between 50 sccm/m$^3$ and 150 sccm/m$^3$ have mobilities far greater than amorphous silicon. At nitrogen flow rates of between 1,000 sccm/m$^3$ and 2,500 sccm/m$^3$, the mobility of the films were, in most cases, higher than 22 cm$^2$/V-s. When compared to amorphous silicon, which has a mobility of about 1 cm$^2$/V-s, the semiconductor films containing zinc, oxygen, and nitrogen have a significant improvement in mobility. Hence, nitrogen to oxygen gas flow ratios of about 10:1 to about 50:1 may produce semiconductor films having mobility greater than 20 times the mobility of amorphous silicon and 2 times the mobility of polysilicon. It is to be understood that while the table shows specific flow rates of nitrogen gas and oxygen gas, the flow rates of the oxygen gas and nitrogen gas are relative to the chamber size and thus, are scalable to account for different chamber sizes.

Table III shows the sheet resistance, carrier concentration, and resistivity as a function of nitrogen gas flow rate according to one embodiment of the invention. For flow ratios of nitrogen gas to oxygen gas between about 10:1 to about 50:1, the sheet resistance of the semiconductor layer comprising zinc, oxygen, and nitrogen may be between about 100 ohm/sq and about 10,000 ohm/sq. With an increase in both nitrogen flow rate and oxygen flow rate, the electron carrier concentration lowers. Consequently, the resistivity increases.

TABLE III

| Nitrogen Flow Rate (sccm/m$^3$) | Oxygen Flow Rate (sccm/m$^3$) | Sheet Resistance (ohm-cm) | Carrier Concentration (#/cc) | Resistivity (ohm-cm) |
|---|---|---|---|---|
| 500 | 50 | 400 | 1.00E+21 | 0.009 |
|  | 100 | 800 | 5.00E+19 | 0.012 |
| 1,000 | 50 | 750 | 5.00E+19 | 0.012 |
|  | 100 | 5000 | 4.00E+18 | 0.1 |
| 1,500 | 0 | 600 | 4.00E+21 | 0.014 |
|  | 50 | 950 | 9.00E+18 | 0.014 |
| 2,000 | 0 | 1000 | 9.00E+20 | 0.014 |
|  | 50 | 2000 | 5.00E+18 | 0.017 |
|  | 100 | 9000 | 2.00E+18 | 0.1 |
| 2,500 | 0 | 6000 | 2.00E+19 | 0.11 |
|  | 50 | 5000 | 4.00E+18 | 0.09 |
|  | 100 | 9000 | 1.50E+18 | 0.12 |

Annealing may also significantly raise the mobility of the semiconductor film containing zinc, oxygen, and nitrogen. Table IV shows the mobility as a function of nitrogen gas flow rate after annealing according to one embodiment of the invention. After annealing, the mobility may be greater than 90 cm$^2$/V-s. The annealing may occur for about five minutes in a nitrogen atmosphere at a temperature of about 400 degrees Celsius.

TABLE IV

| Nitrogen Flow Rate (sccm/m$^3$) | Oxygen Flow Rate (sccm/m$^3$) | Mobility (cm$^2$/V-s) |
|---|---|---|
| 500 | 0 | 1 |
|  | 50 | 13.5 |
|  | 100 | 5 |
| 1,000 | 0 | 28 |
|  | 50 | 48 |
|  | 100 | 15 |
| 1,250 | 0 | 29 |
|  | 100 | 20 |
| 1,500 | 50 | 94 |
| 2,000 | 50 | 92 |
| 2,500 | 0 | 50 |
|  | 50 | 65 |
|  | 100 | 21 |

The amount of dopant may also affect the mobility of the semiconductor film containing zinc, nitrogen, and oxygen. Table V shows the mobility, sheet resistance, carrier concentration, and resistivity for various nitrogen flow rates when reactively sputtering a zinc sputtering target that is doped with 1.0 weight percent aluminum or 1.5 weight percent aluminum.

TABLE V

| Percent Dopant | Nitrogen Flow Rate (sccm/m$^3$) | Mobility (cm$^2$/V-s) | Sheet Resistance (ohm-cm) | Carrier Concentration (#/cc) | Resistivity (ohm-cm) |
|---|---|---|---|---|---|
| 1.0 | 100 | 0.0 | 900 | 1.00E+21 | 0.03 |
|  | 200 | 5.8 | 6,000 | 1.00E+19 | 0.10 |
|  | 300 | 11.0 | 99,000 | 5.00E+17 | 1.00 |
|  | 400 | 10.5 | 110,000 | 4.00E+17 | 3.00 |
| 1.5 | 0 | 0.0 | 150 | 8.00E+21 | 0.01 |
|  | 100 | 0.0 | 1,200 | 7.00E+20 | 0.09 |
|  | 200 | 9.0 | 11,000 | 2.00E+18 | 0.80 |
|  | 300 | 9.1 | 110,000 | 2.50E+17 | 5.00 |

The temperature of the susceptor may also influence the mobility of the semiconductor film. Table VI shows the mobility, sheet resistance, carrier concentration, and resistivity for various nitrogen flow rates in sputtering a zinc sputtering target at temperatures of 30 degrees Celsius, 50 degrees Celsius, and 95 degrees Celsius. As may be seen from Table VI, the reactive sputtering may effectively form a semiconductor film having mobility higher than amorphous silicon and polysilicon at temperatures significantly below 400 degrees Celsius, including temperatures approaching room temperature. Thus, even without annealing, the semiconductor film may have a higher mobility than amorphous silicon.

TABLE VI

| Nitrogen Flow Rate (sccm/m$^3$) | Susceptor Temperature (Celsius) | Mobility (cm$^2$/V-s) | Sheet Resistance (ohm-cm) | Carrier Concentration (#/cc) | Resistivity (ohm-cm) |
|---|---|---|---|---|---|
| 500 | 30 | 1.0 | 200 | 1.00E+21 | 0.009 |
|  | 50 | 1.5 | 210 | 2.00E+19 | 0.008 |
|  | 95 | 2.0 | 300 | 4.00E+18 | 0.014 |
| 1,500 | 30 | 15.0 | 1,100 | 1.00E+21 | 0.030 |
|  | 50 | 31.0 | 950 | 9.00E+18 | 0.029 |
|  | 95 | 17.0 | 850 | 4.00E+18 | 0.028 |
| 2,500 | 30 | 28.0 | 3,100 | 7.00E+20 | 0.900 |
|  | 50 | 33.0 | 3,100 | 2.00E+19 | 0.078 |
|  | 95 | 32.0 | 2,950 | 4.00E+18 | 0.077 |

While the power may be described herein as specific values, it is to be understood that the power applied to the sputtering target is proportional to the area of the target. Hence, power values between about 10 W/cm$^2$ to about 100 W/cm$^2$ will generally achieve the desired results. Table VII shows the affect of the applied DC power on the mobility, carrier concentration, and resistivity for nitrogen gas flows of 1,500 sccm/m$^3$ and 2,500 sccm/m$^3$. Power levels between about 1,000 W and 2,000 W produce semiconductor films having a mobility significantly higher than amorphous silicon.

TABLE VII

| Nitrogen Flow Rate (sccm/m$^3$) | Power (W) | Mobility (cm$^2$/V-s) | Carrier Concentration (#/cc) | Resistivity (ohm-cm) |
|---|---|---|---|---|
| 1,500 | 1,000 | 34 | 5.00E+17 | 0.80 |
|  | 1,500 | 41 | 3.10E+18 | 0.08 |
|  | 2,000 | 31 | 7.20E+18 | 0.05 |
| 2,500 | 1,000 | 30 | 4.00E+17 | 2.00 |
|  | 1,500 | 39 | 1.50E+18 | 0.10 |
|  | 2,000 | 34 | 2.50E+18 | 0.09 |

The film deposited according to the above discussed deposition techniques may comprise a ternary compound semiconductor material having zinc, nitrogen, and oxygen such as $ZnN_xO_y$. In one embodiment, the ternary compound semiconductor material may be doped such as $ZnN_xO_y$:Al. The ternary semiconductor compound may have a high mobility and a low electron carrier density when deposited at room temperature in contrast to zinc oxide which has a high electron mobility and a high electron carrier density. In one embodiment, the ternary compound has a mobility higher than 30 $cm^2$/V-cm and an electron carrier density lower than 1.0 e+19 #/cc. When the film is annealed at about 400 degrees Celsius, the mobility may be increased to greater than 100 $cm^2$/V-cm and the electron carrier density may be lower than 1.0 e+18 #/cc without changing the film crystallographic orientation and composition. The high mobility and low electron density may be achieved for the ternary compound even when the film is an amorphous compound or poorly oriented crystallographic compound.

The optical band gap of the ternary compound may also be improved compared to zinc oxide. Zinc oxide typically has a band gap of about 3.2 eV. The ternary compound comprising zinc, nitrogen, and oxygen, on the other hand, may have a band gap from about 3.1 eV to about 1.2 eV. The band gap may be adjusted by altering the deposition parameters such as nitrogen to oxygen flow ratio, power density, pressure, annealing, and deposition temperature. Due to the lower band gap, the ternary compound may be useful for photovoltaic devices and other electronic devices. At very high processing temperatures such as 600 degrees Celsius, the ternary film may be converted to p-type or n-type semiconductor material. The annealing or plasma treatment may be fine tuned without fundamentally changing the compound structure and chemical composition. The fine tuning permits the properties of the compound to be tailored to meet the performance requirements of devices in which the compound may be used.

The ternary compound may be useful as a transparent semiconductor layer in a thin film transistor (TFT) device, a compound layer in a photovoltaic device or solar panel, or as a compound layer in a sensor device. The ternary compound is very stable. Table VIII below shows the atomic composition of a structure having the ternary compound of the present invention as deposited over a silicon oxide layer and a glass substrate. The ternary compound was sputter deposited in an atmosphere of oxygen, argon, and nitrogen using an aluminum doped zinc sputtering target. Table VIII shows the atomic composition results of the structure deposited at a flow ratio of oxygen to argon to nitrogen of 1:12:30 and a temperature of 50 degrees Celsius. Table IX shows the same film one week after deposition. Table X shows the same film two weeks after deposition.

TABLE VIII

| Sputter Depth (Å) | C | Nitrides | Organic N | $NO_2$ | O | Al | $SiO_2$ | Zn |
|---|---|---|---|---|---|---|---|---|
| 0 | 18.0 | 4.0 | 1.2 | 0.0 | 42.6 | 0.1 | 0.0 | 34.1 |
| 25 | 0.3 | 5.9 | 0.0 | 2.7 | 19.3 | 1.3 | 0.2 | 70.3 |
| 50 | 0.0 | 5.2 | 0.0 | 3.3 | 18.9 | 2.1 | 0.5 | 70.1 |
| 75 | 0.0 | 5.1 | 0.0 | 3.9 | 20.5 | 3.0 | 0.3 | 67.2 |
| 100 | 0.1 | 5.0 | 0.0 | 4.0 | 20.2 | 3.0 | 0.2 | 67.6 |
| 125 | 0.9 | 4.6 | 0.0 | 3.7 | 20.7 | 3.3 | 0.0 | 66.8 |
| 150 | 0.8 | 4.9 | 0.0 | 4.3 | 21.0 | 3.1 | 0.2 | 65.8 |
| 175 | 0.4 | 4.8 | 0.0 | 4.0 | 21.1 | 3.3 | 0.2 | 66.2 |
| 200 | 0.0 | 5.0 | 0.0 | 4.3 | 21.3 | 3.3 | 0.5 | 65.6 |
| 225 | 0.0 | 5.0 | 0.0 | 4.2 | 21.5 | 3.5 | 0.0 | 65.8 |
| 250 | 0.7 | 4.0 | 0.0 | 3.6 | 22.4 | 3.4 | 0.0 | 66.0 |
| 275 | 0.0 | 5.2 | 0.0 | 4.4 | 21.1 | 3.3 | 0.0 | 66.0 |
| 300 | 0.0 | 5.4 | 0.0 | 4.4 | 21.2 | 3.7 | 0.1 | 65.2 |
| 325 | 0.0 | 5.2 | 0.0 | 4.5 | 21.6 | 3.6 | 0.2 | 65.0 |
| 350 | 0.7 | 5.2 | 0.0 | 4.4 | 21.5 | 3.9 | 0.3 | 64.1 |
| 375 | 0.0 | 5.2 | 0.0 | 4.5 | 21.1 | 3.6 | 0.1 | 65.6 |
| 400 | 0.3 | 5.3 | 0.0 | 4.7 | 20.8 | 3.8 | 0.0 | 64.9 |
| 425 | 0.6 | 5.2 | 0.0 | 4.5 | 21.7 | 3.8 | 0.0 | 64.2 |
| 450 | 0.4 | 5.0 | 0.0 | 4.4 | 22.8 | 3.8 | 0.3 | 63.3 |
| 475 | 0.5 | 5.3 | 0.0 | 4.5 | 22.5 | 3.6 | 0.0 | 63.7 |
| 500 | 0.3 | 5.5 | 0.0 | 4.6 | 22.2 | 3.8 | 0.0 | 63.6 |
| 525 | 0.3 | 5.1 | 0.0 | 4.3 | 23.3 | 3.5 | 0.0 | 63.5 |
| 550 | 0.5 | 5.3 | 0.0 | 4.5 | 23.2 | 3.8 | 0.0 | 62.7 |
| 575 | 0.5 | 5.1 | 0.0 | 4.3 | 22.8 | 3.5 | 0.1 | 63.6 |
| 600 | 0.0 | 5.1 | 0.0 | 4.4 | 23.5 | 3.6 | 0.0 | 63.5 |
| 625 | 0.0 | 5.3 | 0.0 | 4.4 | 23.8 | 3.5 | 0.1 | 63.0 |
| 650 | 0.0 | 5.2 | 0.0 | 4.1 | 24.5 | 3.6 | 0.0 | 62.6 |
| 675 | 0.0 | 5.3 | 0.0 | 4.5 | 23.9 | 3.3 | 0.0 | 63.0 |
| 700 | 0.1 | 5.1 | 0.0 | 4.1 | 24.0 | 3.3 | 0.7 | 62.6 |
| 725 | 0.0 | 5.2 | 0.0 | 4.1 | 25.0 | 3.0 | 0.0 | 62.6 |
| 750 | 0.0 | 5.2 | 0.0 | 3.8 | 25.4 | 3.1 | 0.0 | 62.5 |
| 775 | 0.1 | 5.1 | 0.0 | 3.7 | 25.2 | 2.6 | 0.0 | 63.2 |
| 800 | 0.3 | 4.9 | 0.0 | 2.8 | 28.0 | 2.6 | 0.5 | 60.9 |
| 825 | 1.0 | 3.5 | 0.0 | 1.3 | 41.4 | 2.3 | 3.3 | 47.2 |
| 850 | 0.4 | 1.8 | 0.0 | 0.5 | 56.2 | 1.4 | 16.6 | 23.1 |
| 875 | 0.5 | 0.9 | 0.1 | 0.3 | 62.5 | 0.8 | 24.2 | 10.7 |
| 900 | 0.9 | 0.5 | 0.2 | 0.2 | 64.7 | 0.4 | 28.1 | 5.1 |
| 925 | 0.2 | 0.4 | 0.1 | 0.0 | 66.6 | 0.3 | 30.2 | 2.3 |
| 950 | 0.0 | 0.2 | 0.1 | 0.0 | 67.3 | 0.2 | 31.3 | 0.9 |
| 975 | 0.1 | 0.1 | 0.1 | 0.0 | 67.4 | 0.1 | 31.7 | 0.6 |
| 1000 | 0.4 | 0.1 | 0.1 | 0.1 | 66.8 | 0.1 | 32.2 | 0.3 |
| 1025 | 0.0 | 0.2 | 0.1 | 0.0 | 67.2 | 0.1 | 32.1 | 0.4 |
| 1050 | 0.4 | 0.1 | 0.2 | 0.0 | 67.0 | 0.0 | 32.0 | 0.4 |
| 1075 | 0.3 | 0.0 | 0.1 | 0.0 | 67.1 | 0.0 | 32.2 | 0.3 |
| 1100 | 0.0 | 0.0 | 0.1 | 0.0 | 67.4 | 0.0 | 32.1 | 0.4 |
| 1125 | 0.0 | 0.0 | 0.2 | 0.2 | 67.2 | 0.0 | 32.3 | 0.1 |
| 1150 | 0.5 | 0.0 | 0.1 | 0.1 | 67.1 | 0.0 | 32.1 | 0.2 |
| 1175 | 0.0 | 0.0 | 0.1 | 0.0 | 67.2 | 0.0 | 32.6 | 0.2 |
| 1200 | 0.4 | 0.2 | 0.1 | 0.0 | 66.9 | 0.0 | 32.1 | 0.3 |
| 1225 | 0.1 | 0.2 | 0.0 | 0.0 | 67.1 | 0.0 | 32.4 | 0.2 |
| 1250 | 0.0 | 0.2 | 0.0 | 0.0 | 67.2 | 0.0 | 32.4 | 0.3 |

TABLE IX

| Sputter Depth (Å) | C | Nitrides | Organic N | $NO_2$ | O | Al | $SiO_2$ | Zn |
|---|---|---|---|---|---|---|---|---|
| 0 | 32.5 | 1.6 | 1.5 | 0.0 | 40.9 | 0.2 | 0.0 | 23.4 |
| 25 | 0.5 | 4.5 | 0.0 | 2.7 | 20.2 | 1.2 | 0.1 | 70.8 |
| 50 | 0.0 | 5.3 | 0.0 | 3.6 | 17.7 | 1.9 | 0.9 | 70.6 |
| 75 | 0.6 | 5.6 | 0.0 | 4.1 | 18.2 | 2.7 | 0.5 | 68.5 |
| 100 | 0.2 | 5.2 | 0.0 | 3.7 | 18.8 | 3.2 | 0.0 | 68.9 |
| 125 | 0.8 | 5.5 | 0.0 | 4.2 | 17.6 | 3.5 | 0.1 | 68.3 |
| 150 | 0.5 | 5.2 | 0.0 | 3.9 | 19.0 | 3.2 | 0.3 | 67.9 |
| 175 | 0.7 | 5.1 | 0.0 | 4.3 | 18.7 | 3.4 | 0.0 | 67.8 |
| 200 | 0.0 | 5.2 | 0.0 | 4.2 | 19.5 | 3.7 | 0.2 | 67.4 |
| 225 | 0.0 | 5.5 | 0.0 | 4.4 | 18.4 | 3.7 | 0.2 | 67.9 |
| 250 | 0.8 | 5.4 | 0.0 | 4.2 | 18.5 | 3.5 | 0.0 | 67.6 |
| 275 | 0.5 | 5.4 | 0.0 | 4.4 | 19.3 | 3.8 | 0.6 | 66.1 |
| 300 | 0.0 | 5.2 | 0.0 | 4.2 | 20.3 | 3.6 | 0.1 | 66.7 |
| 325 | 0.4 | 5.6 | 0.0 | 4.1 | 20.2 | 3.6 | 0.3 | 65.9 |
| 350 | 0.7 | 5.5 | 0.0 | 4.2 | 19.8 | 4.0 | 0.5 | 65.4 |
| 375 | 0.1 | 5.8 | 0.0 | 4.2 | 19.7 | 3.8 | 0.5 | 66.0 |
| 400 | 0.3 | 5.5 | 0.0 | 4.2 | 20.7 | 3.9 | 0.0 | 65.4 |
| 425 | 0.0 | 6.1 | 0.0 | 4.7 | 20.2 | 3.9 | 0.0 | 65.2 |
| 450 | 0.0 | 5.3 | 0.0 | 4.0 | 20.6 | 3.9 | 0.3 | 65.8 |
| 475 | 0.0 | 5.8 | 0.0 | 4.4 | 20.6 | 3.9 | 0.0 | 65.3 |
| 500 | 0.1 | 5.5 | 0.0 | 4.4 | 21.5 | 3.8 | 0.1 | 64.6 |
| 525 | 0.5 | 5.6 | 0.0 | 4.4 | 20.9 | 3.7 | 0.0 | 64.8 |
| 550 | 0.0 | 5.7 | 0.0 | 4.3 | 21.5 | 3.9 | 0.0 | 64.7 |
| 575 | 0.0 | 5.7 | 0.0 | 4.6 | 22.5 | 3.6 | 0.1 | 63.5 |
| 600 | 0.0 | 5.8 | 0.0 | 4.1 | 23.1 | 3.4 | 0.2 | 63.3 |
| 625 | 0.0 | 5.4 | 0.0 | 4.1 | 22.8 | 3.4 | 0.8 | 63.6 |
| 650 | 0.4 | 5.2 | 0.0 | 3.9 | 23.0 | 3.7 | 0.0 | 63.8 |
| 675 | 0.8 | 5.4 | 0.0 | 4.0 | 23.2 | 3.3 | 0.4 | 62.8 |
| 700 | 0.4 | 5.6 | 0.2 | 4.0 | 23.3 | 3.4 | 0.0 | 63.1 |
| 725 | 0.0 | 5.5 | 0.0 | 3.9 | 24.3 | 3.4 | 0.0 | 62.9 |
| 750 | 0.0 | 5.6 | 0.0 | 4.0 | 24.1 | 3.1 | 0.2 | 63.0 |
| 775 | 0.4 | 5.4 | 0.0 | 3.6 | 24.1 | 3.0 | 0.2 | 63.4 |
| 800 | 0.3 | 5.0 | 0.0 | 3.0 | 26.1 | 2.9 | 0.3 | 62.5 |
| 825 | 0.0 | 3.4 | 0.0 | 1.6 | 36.2 | 2.5 | 4.5 | 51.2 |
| 850 | 0.1 | 1.6 | 0.3 | 0.8 | 52.1 | 1.7 | 16.3 | 27.2 |

TABLE IX-continued

| Sputter Depth (Å) | C | Nitrides | Organic N | NO$_2$ | O | Al | SiO$_2$ | Zn |
|---|---|---|---|---|---|---|---|---|
| 875 | 0.1 | 1.1 | 0.1 | 0.4 | 60.6 | 0.9 | 24.0 | 12.6 |
| 900 | 0.6 | 0.3 | 0.1 | 0.1 | 65.1 | 0.5 | 27.5 | 6.0 |
| 925 | 0.0 | 0.0 | 0.2 | 0.1 | 67.0 | 0.3 | 29.6 | 2.8 |
| 950 | 0.2 | 0.0 | 0.2 | 0.0 | 67.8 | 0.2 | 30.7 | 0.9 |
| 975 | 0.0 | 0.0 | 0.3 | 0.1 | 67.9 | 0.1 | 31.2 | 0.4 |
| 1000 | 0.0 | 0.0 | 0.1 | 0.0 | 67.5 | 0.1 | 32.0 | 0.2 |
| 1025 | 0.2 | 0.0 | 0.0 | 0.0 | 68.1 | 0.0 | 31.5 | 0.2 |
| 1050 | 0.0 | 0.0 | 0.0 | 0.0 | 67.8 | 0.0 | 31.9 | 0.2 |
| 1075 | 0.1 | 0.0 | 0.0 | 0.0 | 67.6 | 0.1 | 32.2 | 0.0 |
| 1100 | 0.6 | 0.0 | 0.1 | 0.0 | 67.2 | 0.1 | 31.8 | 0.2 |
| 1125 | 0.1 | 0.0 | 0.0 | 0.0 | 68.1 | 0.0 | 31.7 | 0.1 |
| 1150 | 0.3 | 0.0 | 0.1 | 0.0 | 67.8 | 0.0 | 31.7 | 0.2 |
| 1175 | 0.4 | 0.0 | 0.1 | 0.0 | 67.9 | 0.0 | 31.5 | 0.1 |
| 1200 | 0.0 | 0.0 | 0.0 | 0.0 | 68.0 | 0.1 | 31.8 | 0.1 |
| 1225 | 0.3 | 0.0 | 0.1 | 0.0 | 67.8 | 0.0 | 31.6 | 0.1 |
| 1250 | 0.1 | 0.0 | 0.0 | 0.0 | 68.2 | 0.1 | 31.6 | 0.0 |
| 1275 | 0.0 | 0.0 | 0.0 | 0.0 | 68.3 | 0.0 | 31.6 | 0.0 |
| 1300 | 0.0 | 0.0 | 0.0 | 0.0 | 68.2 | 0.1 | 31.7 | 0.1 |
| 1325 | 0.0 | 0.0 | 0.0 | 0.0 | 68.4 | 0.0 | 31.5 | 0.1 |
| 1350 | 0.2 | 0.0 | 0.0 | 0.0 | 68.2 | 0.0 | 31.5 | 0.0 |
| 1375 | 0.1 | 0.0 | 0.0 | 0.0 | 67.9 | 0.1 | 31.7 | 0.1 |
| 1400 | 0.0 | 0.1 | 0.1 | 0.0 | 68.1 | 0.0 | 31.6 | 0.1 |
| 1425 | 0.2 | 0.0 | 0.0 | 0.0 | 68.3 | 0.0 | 31.4 | 0.1 |
| 1450 | 0.1 | 0.0 | 0.1 | 0.0 | 68.1 | 0.1 | 31.3 | 0.3 |
| 1475 | 0.1 | 0.0 | 0.0 | 0.0 | 68.6 | 0.1 | 31.1 | 0.1 |
| 1500 | 0.0 | 0.1 | 0.1 | 0.0 | 68.4 | 0.1 | 31.3 | 0.0 |

TABLE X

| Sputter Depth (Å) | C | Nitrides | Organic N | NO$_2$ | O | Al | SiO$_2$ | Zn |
|---|---|---|---|---|---|---|---|---|
| 0 | 16.8 | 0.3 | 2.1 | 0.0 | 47.8 | 0.2 | 0.0 | 32.8 |
| 25 | 0.4 | 1.8 | 1.5 | 0.9 | 35.8 | 0.7 | 0.0 | 58.9 |
| 50 | 0.6 | 3.6 | 0.6 | 2.0 | 26.5 | 1.0 | 0.0 | 65.7 |
| 75 | 0.0 | 4.8 | 0.0 | 3.1 | 19.6 | 1.4 | 0.5 | 70.6 |
| 100 | 1.0 | 5.5 | 0.0 | 3.6 | 17.9 | 2.5 | 0.0 | 69.4 |
| 125 | 0.6 | 5.5 | 0.0 | 3.5 | 18.9 | 2.8 | 0.4 | 68.4 |
| 150 | 1.0 | 5.1 | 0.0 | 3.6 | 19.1 | 3.1 | 0.0 | 68.0 |
| 175 | 1.3 | 5.3 | 0.0 | 4.2 | 19.5 | 3.3 | 0.0 | 66.4 |
| 200 | 1.4 | 5.3 | 0.0 | 4.1 | 19.1 | 3.5 | 0.1 | 66.6 |
| 225 | 0.2 | 5.2 | 0.0 | 3.9 | 20.1 | 3.4 | 0.0 | 67.2 |
| 250 | 0.4 | 5.4 | 0.0 | 4.1 | 19.6 | 3.3 | 0.0 | 67.2 |
| 275 | 0.2 | 5.5 | 0.0 | 4.2 | 20.4 | 3.6 | 0.3 | 65.8 |
| 300 | 0.9 | 5.3 | 0.0 | 4.2 | 20.5 | 3.3 | 0.0 | 65.8 |
| 325 | 0.6 | 5.1 | 0.0 | 4.1 | 21.1 | 3.3 | 0.3 | 65.5 |
| 350 | 0.2 | 5.4 | 0.0 | 4.2 | 20.4 | 3.5 | 0.0 | 66.3 |
| 375 | 0.4 | 5.7 | 0.0 | 4.3 | 19.4 | 3.8 | 0.1 | 66.2 |
| 400 | 0.3 | 5.6 | 0.1 | 4.4 | 20.6 | 3.6 | 0.3 | 65.1 |
| 425 | 0.0 | 5.7 | 0.0 | 4.4 | 20.8 | 3.6 | 0.2 | 65.4 |
| 450 | 1.2 | 6.0 | 0.0 | 4.5 | 20.6 | 3.5 | 0.2 | 64.0 |
| 475 | 0.0 | 5.9 | 0.0 | 4.3 | 20.9 | 3.7 | 0.1 | 65.1 |
| 500 | 0.0 | 5.9 | 0.0 | 4.2 | 19.9 | 3.8 | 0.4 | 65.9 |
| 525 | 0.0 | 5.6 | 0.2 | 4.2 | 22.4 | 3.6 | 0.0 | 64.0 |
| 550 | 1.7 | 6.0 | 0.0 | 4.2 | 20.7 | 3.7 | 0.0 | 63.8 |
| 575 | 0.1 | 5.9 | 0.0 | 4.3 | 21.3 | 3.6 | 0.2 | 64.6 |
| 600 | 0.0 | 5.8 | 0.0 | 4.4 | 21.8 | 3.5 | 0.0 | 64.4 |
| 625 | 0.2 | 5.5 | 0.0 | 3.8 | 24.8 | 3.4 | 0.1 | 62.2 |
| 650 | 0.7 | 5.7 | 0.0 | 4.4 | 23.1 | 3.4 | 0.2 | 62.6 |
| 675 | 0.0 | 5.8 | 0.0 | 4.3 | 22.6 | 3.3 | 0.0 | 64.0 |
| 700 | 0.6 | 5.3 | 0.0 | 3.9 | 22.8 | 3.1 | 0.0 | 64.3 |
| 725 | 0.3 | 5.5 | 0.0 | 3.7 | 24.7 | 3.2 | 0.0 | 62.5 |
| 750 | 0.0 | 5.2 | 0.0 | 3.7 | 25.1 | 3.0 | 0.2 | 62.9 |
| 775 | 0.9 | 5.3 | 0.0 | 3.6 | 24.8 | 2.9 | 0.0 | 62.6 |
| 800 | 0.0 | 5.3 | 0.0 | 2.8 | 26.5 | 2.9 | 1.0 | 61.5 |
| 825 | 1.0 | 4.0 | 0.0 | 1.5 | 36.7 | 2.1 | 5.3 | 49.5 |
| 850 | 0.5 | 2.4 | 0.0 | 0.8 | 50.0 | 1.7 | 14.5 | 30.2 |
| 875 | 0.7 | 1.6 | 0.0 | 0.4 | 58.4 | 0.9 | 22.4 | 15.7 |
| 900 | 0.6 | 1.1 | 0.0 | 0.2 | 63.0 | 0.5 | 26.5 | 8.1 |
| 925 | 0.2 | 0.6 | 0.2 | 0.1 | 65.8 | 0.3 | 28.6 | 4.2 |
| 950 | 0.1 | 0.2 | 0.3 | 0.0 | 66.9 | 0.1 | 30.5 | 2.1 |
| 975 | 0.4 | 0.4 | 0.1 | 0.0 | 66.9 | 0.1 | 30.9 | 1.2 |
| 1000 | 0.3 | 0.0 | 0.3 | 0.0 | 67.6 | 0.0 | 31.4 | 0.5 |

TABLE X-continued

| Sputter Depth (Å) | C | Nitrides | Organic N | NO$_2$ | O | Al | SiO$_2$ | Zn |
|---|---|---|---|---|---|---|---|---|
| 1025 | 0.1 | 0.0 | 0.3 | 0.1 | 67.5 | 0.0 | 31.7 | 0.4 |
| 1050 | 0.1 | 0.0 | 0.3 | 0.1 | 67.5 | 0.1 | 31.7 | 0.3 |
| 1075 | 0.2 | 0.0 | 0.3 | 0.0 | 67.5 | 0.0 | 31.7 | 0.2 |
| 1100 | 0.2 | 0.0 | 0.3 | 0.1 | 67.5 | 0.0 | 31.8 | 0.2 |
| 1125 | 0.6 | 0.0 | 0.2 | 0.0 | 67.5 | 0.0 | 31.4 | 0.3 |
| 1150 | 0.5 | 0.0 | 0.3 | 0.0 | 67.3 | 0.0 | 31.5 | 0.3 |
| 1175 | 0.1 | 0.0 | 0.2 | 0.0 | 67.6 | 0.0 | 31.9 | 0.2 |
| 1200 | 0.2 | 0.0 | 0.3 | 0.0 | 67.3 | 0.0 | 32.0 | 0.2 |
| 1225 | 0.3 | 0.0 | 0.3 | 0.0 | 67.1 | 0.0 | 31.9 | 0.3 |
| 1250 | 0.2 | 0.0 | 0.2 | 0.0 | 67.3 | 0.0 | 32.0 | 0.3 |
| 1275 | 0.2 | 0.0 | 0.2 | 0.0 | 67.5 | 0.1 | 31.6 | 0.3 |
| 1300 | 0.2 | 0.0 | 0.1 | 0.0 | 67.4 | 0.1 | 31.9 | 0.3 |
| 1325 | 0.2 | 0.0 | 0.2 | 0.0 | 67.5 | 0.0 | 32.1 | 0.2 |
| 1350 | 0.0 | 0.0 | 0.2 | 0.0 | 67.5 | 0.0 | 32.1 | 0.2 |
| 1375 | 0.2 | 0.2 | 0.2 | 0.0 | 67.7 | 0.0 | 31.5 | 0.2 |
| 1400 | 0.1 | 0.0 | 0.3 | 0.0 | 67.1 | 0.1 | 32.0 | 0.4 |
| 1425 | 0.0 | 0.2 | 0.2 | 0.1 | 67.7 | 0.0 | 31.6 | 0.3 |
| 1450 | 0.2 | 0.0 | 0.3 | 0.1 | 67.4 | 0.0 | 31.8 | 0.2 |
| 1475 | 0.0 | 0.0 | 0.3 | 0.0 | 67.6 | 0.0 | 31.9 | 0.2 |
| 1500 | 0.0 | 0.0 | 0.3 | 0.0 | 67.5 | 0.0 | 32.0 | 0.2 |
| 1525 | 0.0 | 0.0 | 0.3 | 0.0 | 67.9 | 0.0 | 31.6 | 0.2 |
| 1550 | 0.5 | 0.1 | 0.3 | 0.0 | 67.5 | 0.0 | 31.3 | 0.2 |
| 1575 | 0.2 | 0.1 | 0.3 | 0.0 | 67.6 | 0.0 | 31.5 | 0.3 |
| 1600 | 0.3 | 0.1 | 0.3 | 0.1 | 67.5 | 0.0 | 31.5 | 0.2 |
| 1625 | 0.0 | 0.0 | 0.3 | 0.0 | 67.6 | 0.0 | 31.8 | 0.3 |
| 1650 | 0.0 | 0.0 | 0.3 | 0.0 | 67.5 | 0.0 | 31.8 | 0.3 |
| 1675 | 0.2 | 0.0 | 0.3 | 0.0 | 67.6 | 0.0 | 31.6 | 0.3 |
| 1700 | 0.7 | 0.1 | 0.3 | 0.0 | 67.2 | 0.0 | 31.5 | 0.3 |
| 1725 | 0.0 | 0.1 | 0.2 | 0.0 | 67.8 | 0.0 | 31.6 | 0.3 |
| 1750 | 0.2 | 0.0 | 0.2 | 0.0 | 67.5 | 0.0 | 31.7 | 0.4 |
| 1775 | 0.1 | 0.0 | 0.3 | 0.0 | 67.1 | 0.0 | 32.3 | 0.3 |
| 1800 | 0.0 | 0.0 | 0.2 | 0.0 | 67.8 | 0.1 | 31.7 | 0.3 |
| 1825 | 0.4 | 0.0 | 0.2 | 0.0 | 67.4 | 0.0 | 31.8 | 0.2 |
| 1850 | 0.3 | 0.0 | 0.3 | 0.1 | 67.6 | 0.0 | 31.5 | 0.3 |
| 1875 | 0.5 | 0.0 | 0.2 | 0.0 | 67.2 | 0.0 | 31.8 | 0.3 |

As may be seen from Tables VIII, IX, and X, the ternary compound was deposited as a film with a thickness of about 850 Angstroms. A natural passivation layer may form to a depth of about 25 Angstroms on top of the ternary compound layer. Thereafter, the layer maintained a zinc concentration of about 62 atomic percent to about 71 atomic percent, an oxygen concentration of about 18 atomic percent to about 26 atomic percent, a nitride concentration of about 4.0 atomic percent to about 6.1 atomic percent, and a nitrite concentration of about 2.7 atomic percent to about 4.7 atomic percent for two weeks.

When the film is annealed, the composition of the film remains substantially the same as the non-annealed film. Tables XI, XII, and XIII show the composition of the annealed ternary compound of Tables VIII, IX, and X respectively.

TABLE XI

| Sputter Depth (Å) | C | Nitrides | Organic N | NO$_2$ | O | Al | SiO$_2$ | Zn |
|---|---|---|---|---|---|---|---|---|
| 0 | 19.7 | 5.8 | 2.1 | 0.1 | 35.2 | 0.7 | 0.0 | 36.5 |
| 25 | 0.0 | 6.0 | 0.1 | 3.0 | 22.2 | 1.8 | 0.0 | 67.0 |
| 50 | 0.0 | 6.0 | 0.0 | 3.6 | 20.3 | 2.4 | 0.4 | 67.4 |
| 75 | 0.0 | 6.3 | 0.0 | 3.9 | 19.3 | 3.1 | 0.0 | 67.5 |
| 100 | 0.0 | 6.0 | 0.0 | 3.9 | 18.8 | 3.4 | 0.0 | 67.9 |
| 125 | 0.2 | 5.7 | 0.0 | 4.0 | 18.9 | 3.3 | 0.6 | 67.4 |
| 150 | 0.0 | 5.8 | 0.0 | 4.0 | 19.9 | 3.4 | 0.1 | 66.9 |
| 175 | 0.0 | 5.8 | 0.0 | 4.8 | 18.4 | 3.4 | 0.6 | 67.1 |
| 200 | 0.0 | 5.6 | 0.0 | 4.5 | 20.5 | 3.3 | 0.4 | 65.7 |
| 225 | 0.0 | 5.7 | 0.0 | 4.9 | 19.4 | 3.3 | 0.4 | 66.4 |
| 250 | 1.0 | 5.5 | 0.0 | 4.6 | 18.8 | 4.0 | 0.0 | 66.1 |

TABLE XI-continued

| Sputter Depth (Å) | C | Nitrides | Organic N | NO$_2$ | O | Al | SiO$_2$ | Zn |
|---|---|---|---|---|---|---|---|---|
| 275 | 0.0 | 5.4 | 0.0 | 4.5 | 19.6 | 3.9 | 0.6 | 65.9 |
| 300 | 0.3 | 5.8 | 0.0 | 4.7 | 20.3 | 3.9 | 0.0 | 65.0 |
| 325 | 0.0 | 5.8 | 0.0 | 4.7 | 20.7 | 3.7 | 0.0 | 65.1 |
| 350 | 0.3 | 5.8 | 0.0 | 4.6 | 21.3 | 3.9 | 0.1 | 64.1 |
| 375 | 0.0 | 5.9 | 0.0 | 4.7 | 21.0 | 4.0 | 0.1 | 64.3 |
| 400 | 1.3 | 5.8 | 0.0 | 4.7 | 21.2 | 4.1 | 0.0 | 62.9 |
| 425 | 0.0 | 5.9 | 0.0 | 4.8 | 21.3 | 3.9 | 0.5 | 63.7 |
| 450 | 0.0 | 6.0 | 0.0 | 4.9 | 20.1 | 4.2 | 0.0 | 64.8 |
| 475 | 1.0 | 5.9 | 0.0 | 4.8 | 20.9 | 3.9 | 0.0 | 63.6 |
| 500 | 0.6 | 5.8 | 0.0 | 4.7 | 22.1 | 4.0 | 0.8 | 62.0 |
| 525 | 0.4 | 5.9 | 0.0 | 4.7 | 21.8 | 4.0 | 0.5 | 62.7 |
| 550 | 0.0 | 5.9 | 0.0 | 4.8 | 21.8 | 4.1 | 0.2 | 63.3 |
| 575 | 0.1 | 5.9 | 0.0 | 4.7 | 22.5 | 4.1 | 0.0 | 62.7 |
| 600 | 0.0 | 5.9 | 0.0 | 4.6 | 22.5 | 4.1 | 0.0 | 62.9 |
| 625 | 0.0 | 5.8 | 0.0 | 4.5 | 23.4 | 3.8 | 0.0 | 62.4 |
| 650 | 0.1 | 5.7 | 0.0 | 4.8 | 22.0 | 3.9 | 0.3 | 63.3 |
| 675 | 0.2 | 5.7 | 0.0 | 4.6 | 23.4 | 3.7 | 0.2 | 62.2 |
| 700 | 0.3 | 5.7 | 0.0 | 4.6 | 23.9 | 3.7 | 0.1 | 61.8 |
| 725 | 0.3 | 5.5 | 0.0 | 4.3 | 24.5 | 3.5 | 0.4 | 61.6 |
| 750 | 0.0 | 5.3 | 0.0 | 4.3 | 24.4 | 3.3 | 0.0 | 62.6 |
| 775 | 0.2 | 4.8 | 0.0 | 3.8 | 26.2 | 2.9 | 0.8 | 61.3 |
| 800 | 0.7 | 3.1 | 0.6 | 1.9 | 35.9 | 2.6 | 2.9 | 52.3 |
| 825 | 0.3 | 1.3 | 0.6 | 0.8 | 52.3 | 1.9 | 14.9 | 28.0 |
| 850 | 0.0 | 0.6 | 0.4 | 0.3 | 60.9 | 0.8 | 23.9 | 13.2 |
| 875 | 0.2 | 0.4 | 0.3 | 0.3 | 64.7 | 0.7 | 27.1 | 6.5 |
| 900 | 0.0 | 0.1 | 0.1 | 0.0 | 66.8 | 0.4 | 29.6 | 3.1 |
| 925 | 0.3 | 0.1 | 0.1 | 0.0 | 67.2 | 0.2 | 30.9 | 1.2 |
| 950 | 0.0 | 0.0 | 0.1 | 0.0 | 68.2 | 0.1 | 31.0 | 0.7 |
| 975 | 0.2 | 0.0 | 0.0 | 0.0 | 67.5 | 0.0 | 31.7 | 0.5 |
| 1000 | 0.0 | 0.0 | 0.0 | 0.0 | 67.7 | 0.1 | 31.8 | 0.3 |
| 1025 | 0.5 | 0.0 | 0.0 | 0.0 | 67.4 | 0.0 | 31.7 | 0.4 |
| 1050 | 0.1 | 0.1 | 0.0 | 0.0 | 67.9 | 0.0 | 31.6 | 0.3 |
| 1075 | 0.0 | 0.1 | 0.0 | 0.0 | 67.8 | 0.0 | 31.9 | 0.2 |
| 1100 | 0.0 | 0.0 | 0.0 | 0.0 | 67.8 | 0.0 | 31.9 | 0.3 |
| 1125 | 0.0 | 0.1 | 0.0 | 0.0 | 67.4 | 0.1 | 32.2 | 0.3 |
| 1150 | 0.0 | 0.0 | 0.1 | 0.0 | 68.0 | 0.1 | 31.7 | 0.2 |
| 1175 | 0.0 | 0.0 | 0.0 | 0.0 | 67.9 | 0.1 | 31.9 | 0.2 |
| 1200 | 0.3 | 0.1 | 0.0 | 0.0 | 67.1 | 0.0 | 32.1 | 0.4 |
| 1225 | 0.0 | 0.0 | 0.0 | 0.0 | 67.7 | 0.1 | 32.0 | 0.2 |
| 1250 | 0.2 | 0.0 | 0.0 | 0.0 | 67.6 | 0.0 | 32.0 | 0.2 |

TABLE XII

| Sputter Depth (Å) | C | Nitrides | Organic N | NO$_2$ | O | Al | SiO$_2$ | Zn |
|---|---|---|---|---|---|---|---|---|
| 0 | 33.2 | 4.2 | 2.4 | 0.1 | 34.2 | 0.4 | 0.4 | 25.0 |
| 25 | 0.1 | 6.1 | 0.2 | 3.1 | 22.3 | 1.7 | 0.6 | 65.8 |
| 50 | 0.0 | 6.3 | 0.0 | 3.4 | 20.1 | 2.9 | 0.2 | 67.1 |
| 75 | 0.0 | 5.8 | 0.2 | 3.9 | 19.5 | 3.0 | 0.3 | 67.3 |
| 100 | 0.0 | 6.0 | 0.0 | 4.0 | 19.2 | 3.0 | 0.2 | 67.6 |
| 125 | 0.0 | 5.6 | 0.2 | 4.0 | 19.5 | 3.3 | 0.2 | 67.3 |
| 150 | 0.1 | 5.7 | 0.1 | 4.3 | 20.4 | 3.3 | 0.4 | 65.9 |
| 175 | 0.1 | 6.1 | 0.1 | 4.4 | 19.8 | 3.5 | 0.8 | 65.3 |
| 200 | 0.0 | 6.1 | 0.0 | 4.2 | 20.1 | 3.8 | 0.3 | 65.6 |
| 225 | 1.1 | 5.8 | 0.0 | 4.6 | 20.0 | 3.2 | 0.4 | 64.9 |
| 250 | 1.1 | 5.5 | 0.0 | 4.2 | 20.8 | 3.9 | 0.0 | 64.6 |
| 275 | 0.8 | 5.5 | 0.1 | 4.3 | 20.2 | 3.8 | 0.2 | 65.1 |
| 300 | 0.1 | 5.6 | 0.0 | 4.7 | 20.3 | 3.9 | 0.2 | 65.4 |
| 325 | 0.6 | 5.7 | 0.0 | 4.3 | 20.4 | 4.1 | 0.1 | 65.0 |
| 350 | 0.0 | 5.8 | 0.0 | 4.7 | 21.0 | 4.1 | 0.0 | 64.4 |
| 375 | 0.4 | 5.7 | 0.0 | 4.3 | 21.7 | 4.2 | 0.3 | 63.6 |
| 400 | 0.0 | 5.6 | 0.0 | 4.3 | 21.1 | 4.4 | 0.0 | 64.5 |
| 425 | 0.0 | 5.9 | 0.1 | 4.5 | 21.8 | 4.2 | 0.0 | 63.5 |
| 450 | 0.4 | 6.0 | 0.0 | 4.4 | 21.8 | 4.2 | 0.0 | 63.2 |
| 475 | 0.0 | 5.8 | 0.0 | 4.2 | 22.2 | 4.3 | 0.0 | 63.5 |
| 500 | 0.0 | 6.0 | 0.3 | 4.4 | 22.0 | 4.0 | 0.3 | 63.1 |
| 525 | 0.4 | 5.8 | 0.0 | 4.6 | 23.2 | 4.0 | 0.2 | 61.9 |
| 550 | 0.0 | 5.5 | 0.1 | 4.2 | 22.2 | 4.1 | 0.0 | 64.0 |
| 575 | 0.7 | 5.7 | 0.2 | 4.2 | 22.6 | 4.1 | 0.0 | 62.5 |
| 600 | 0.0 | 5.7 | 0.0 | 3.8 | 23.3 | 3.7 | 0.0 | 63.4 |
| 625 | 0.7 | 5.8 | 0.0 | 3.9 | 23.2 | 4.0 | 0.4 | 62.1 |

TABLE XII-continued

| Sputter Depth (Å) | C | Nitrides | Organic N | NO$_2$ | O | Al | SiO$_2$ | Zn |
|---|---|---|---|---|---|---|---|---|
| 650 | 0.0 | 5.6 | 0.0 | 3.9 | 24.1 | 3.8 | 0.0 | 62.6 |
| 675 | 0.0 | 5.7 | 0.0 | 3.9 | 24.1 | 3.7 | 0.0 | 62.7 |
| 700 | 0.1 | 5.7 | 0.2 | 4.1 | 23.5 | 3.6 | 0.0 | 62.9 |
| 725 | 0.0 | 5.0 | 0.2 | 3.9 | 24.5 | 3.4 | 0.0 | 63.1 |
| 750 | 0.0 | 5.4 | 0.2 | 3.8 | 25.0 | 3.2 | 0.0 | 62.4 |
| 775 | 0.1 | 5.2 | 0.0 | 3.4 | 25.1 | 3.2 | 0.1 | 63.0 |
| 800 | 0.8 | 4.8 | 0.0 | 2.5 | 28.7 | 2.9 | 1.1 | 59.2 |
| 825 | 1.0 | 2.9 | 0.0 | 1.1 | 42.5 | 2.2 | 7.9 | 42.4 |
| 850 | 0.4 | 1.1 | 0.4 | 0.4 | 55.6 | 1.4 | 20.0 | 20.7 |
| 875 | 0.3 | 0.5 | 0.5 | 0.2 | 62.2 | 0.9 | 25.8 | 9.6 |
| 900 | 0.3 | 0.2 | 0.5 | 0.2 | 65.2 | 0.4 | 28.9 | 4.4 |
| 925 | 0.8 | 0.1 | 0.2 | 0.1 | 66.4 | 0.2 | 30.4 | 1.9 |
| 950 | 0.0 | 0.0 | 0.1 | 0.0 | 67.3 | 0.2 | 31.6 | 0.7 |
| 975 | 0.1 | 0.0 | 0.3 | 0.1 | 67.3 | 0.0 | 31.9 | 0.3 |
| 1000 | 0.0 | 0.0 | 0.0 | 0.0 | 67.9 | 0.1 | 31.9 | 0.1 |
| 1025 | 0.2 | 0.0 | 0.1 | 0.0 | 67.7 | 0.0 | 31.8 | 0.2 |
| 1050 | 0.2 | 0.0 | 0.1 | 0.1 | 67.0 | 0.0 | 32.5 | 0.1 |
| 1075 | 0.7 | 0.0 | 0.1 | 0.0 | 67.0 | 0.1 | 32.0 | 0.0 |
| 1100 | 0.2 | 0.0 | 0.1 | 0.0 | 67.3 | 0.1 | 32.3 | 0.0 |
| 1125 | 0.6 | 0.0 | 0.1 | 0.0 | 66.8 | 0.1 | 32.4 | 0.0 |
| 1150 | 0.2 | 0.1 | 0.1 | 0.1 | 67.4 | 0.1 | 32.1 | 0.1 |
| 1175 | 0.2 | 0.0 | 0.0 | 0.0 | 67.6 | 0.0 | 32.2 | 0.0 |
| 1200 | 0.1 | 0.0 | 0.0 | 0.0 | 67.5 | 0.0 | 32.4 | 0.0 |
| 1225 | 0.0 | 0.0 | 0.0 | 0.0 | 67.4 | 0.0 | 32.6 | 0.0 |
| 1250 | 0.3 | 0.0 | 0.1 | 0.0 | 67.2 | 0.1 | 32.3 | 0.1 |
| 1275 | 0.3 | 0.1 | 0.1 | 0.0 | 67.0 | 0.1 | 32.5 | 0.1 |
| 1300 | 0.3 | 0.1 | 0.1 | 0.1 | 67.2 | 0.0 | 32.2 | 0.0 |
| 1325 | 0.5 | 0.0 | 0.1 | 0.0 | 67.2 | 0.0 | 32.1 | 0.0 |
| 1350 | 0.3 | 0.0 | 0.1 | 0.0 | 67.2 | 0.0 | 32.4 | 0.0 |
| 1375 | 0.2 | 0.0 | 0.0 | 0.0 | 67.2 | 0.0 | 32.5 | 0.1 |
| 1400 | 0.2 | 0.0 | 0.1 | 0.0 | 67.4 | 0.0 | 32.3 | 0.0 |
| 1425 | 0.2 | 0.0 | 0.1 | 0.0 | 67.5 | 0.0 | 32.2 | 0.1 |
| 1450 | 0.0 | 0.0 | 0.1 | 0.1 | 67.2 | 0.0 | 32.5 | 0.1 |
| 1475 | 0.2 | 0.0 | 0.1 | 0.0 | 67.3 | 0.0 | 32.4 | 0.0 |
| 1500 | 0.2 | 0.0 | 0.1 | 0.0 | 67.3 | 0.0 | 32.3 | 0.0 |

TABLE XIII

| Sputter Depth (Å) | C | Nitrides | Organic N | NO$_2$ | O | Al | SiO$_2$ | Zn |
|---|---|---|---|---|---|---|---|---|
| 0 | 20.1 | 4.8 | 2.5 | 0.0 | 38.3 | 0.6 | 0.0 | 33.7 |
| 25 | 0.2 | 5.0 | 1.0 | 3.1 | 22.6 | 1.8 | 0.1 | 66.2 |
| 50 | 1.1 | 5.6 | 0.4 | 3.6 | 20.5 | 2.6 | 0.4 | 65.8 |
| 75 | 0.0 | 5.9 | 0.2 | 4.0 | 19.3 | 2.8 | 0.0 | 67.8 |
| 100 | 0.0 | 6.1 | 0.0 | 4.2 | 19.7 | 3.2 | 0.1 | 66.7 |
| 125 | 0.1 | 6.2 | 0.0 | 4.0 | 19.9 | 3.1 | 0.0 | 66.7 |
| 150 | 0.0 | 6.3 | 0.0 | 4.4 | 20.7 | 3.0 | 0.0 | 65.6 |
| 175 | 0.0 | 6.1 | 0.0 | 4.5 | 20.2 | 3.4 | 0.7 | 65.2 |
| 200 | 0.1 | 5.9 | 0.0 | 4.2 | 19.5 | 3.6 | 0.4 | 66.3 |
| 225 | 0.1 | 5.9 | 0.0 | 4.3 | 20.3 | 3.7 | 0.0 | 65.7 |
| 250 | 0.2 | 6.4 | 0.0 | 4.7 | 19.1 | 3.7 | 0.0 | 65.9 |
| 275 | 0.0 | 5.6 | 0.0 | 4.2 | 22.2 | 3.7 | 0.0 | 64.3 |
| 300 | 0.0 | 5.8 | 0.0 | 4.6 | 20.8 | 3.8 | 0.0 | 65.0 |
| 325 | 0.0 | 5.6 | 0.0 | 4.6 | 22.1 | 3.9 | 0.0 | 63.8 |
| 350 | 0.4 | 5.9 | 0.1 | 4.4 | 21.1 | 3.8 | 0.0 | 64.3 |
| 375 | 0.0 | 5.9 | 0.0 | 4.5 | 22.4 | 3.8 | 0.0 | 63.5 |
| 400 | 0.6 | 6.0 | 0.0 | 4.6 | 21.5 | 3.9 | 0.4 | 63.1 |
| 425 | 0.0 | 5.6 | 0.1 | 4.5 | 20.5 | 4.1 | 0.0 | 65.3 |
| 450 | 0.3 | 5.8 | 0.1 | 4.3 | 22.5 | 3.6 | 0.0 | 63.5 |
| 475 | 0.2 | 6.0 | 0.0 | 4.6 | 22.0 | 3.8 | 0.1 | 63.2 |
| 500 | 0.0 | 5.8 | 0.0 | 4.2 | 22.7 | 3.9 | 0.0 | 63.4 |
| 525 | 0.4 | 6.1 | 0.0 | 4.5 | 22.4 | 3.9 | 0.1 | 62.7 |
| 550 | 0.0 | 5.9 | 0.0 | 4.3 | 23.3 | 4.0 | 0.3 | 62.3 |
| 575 | 0.4 | 5.5 | 0.2 | 4.3 | 22.8 | 3.8 | 0.0 | 63.0 |
| 600 | 0.2 | 5.8 | 0.3 | 4.1 | 22.5 | 3.8 | 0.0 | 63.4 |
| 625 | 0.0 | 6.1 | 0.0 | 4.3 | 23.9 | 3.8 | 0.0 | 62.0 |
| 650 | 0.0 | 6.0 | 0.0 | 4.3 | 23.7 | 3.8 | 0.0 | 62.3 |
| 675 | 0.9 | 5.8 | 0.0 | 4.1 | 23.3 | 3.5 | 0.0 | 62.5 |
| 700 | 0.0 | 5.7 | 0.0 | 4.3 | 23.2 | 3.6 | 0.0 | 63.3 |
| 725 | 0.2 | 5.5 | 0.2 | 3.9 | 24.7 | 3.3 | 0.1 | 62.2 |
| 750 | 0.2 | 5.0 | 0.3 | 3.9 | 25.3 | 3.3 | 0.0 | 61.9 |

TABLE XIII-continued

| Sputter Depth (Å) | C | Nitrides | Organic N | NO$_2$ | O | Al | SiO$_2$ | Zn |
|---|---|---|---|---|---|---|---|---|
| 775 | 0.1 | 4.8 | 0.3 | 3.6 | 24.9 | 3.0 | 0.0 | 63.4 |
| 800 | 0.3 | 4.5 | 0.5 | 2.4 | 29.6 | 2.9 | 1.3 | 58.7 |
| 825 | 0.4 | 2.7 | 0.3 | 1.2 | 44.6 | 2.1 | 7.7 | 41.0 |
| 850 | 0.2 | 1.6 | 0.2 | 0.6 | 57.0 | 1.2 | 19.4 | 19.9 |
| 875 | 0.1 | 0.8 | 0.2 | 0.3 | 63.0 | 0.6 | 25.6 | 9.5 |
| 900 | 0.0 | 0.3 | 0.4 | 0.1 | 65.8 | 0.4 | 28.8 | 4.3 |
| 925 | 0.1 | 0.3 | 0.1 | 0.1 | 66.5 | 0.2 | 30.8 | 1.8 |
| 950 | 0.0 | 0.0 | 0.1 | 0.0 | 67.4 | 0.1 | 31.5 | 1.0 |
| 975 | 0.1 | 0.0 | 0.1 | 0.0 | 67.5 | 0.0 | 31.9 | 0.4 |
| 1000 | 0.5 | 0.0 | 0.3 | 0.0 | 67.1 | 0.1 | 31.7 | 0.4 |
| 1025 | 0.2 | 0.1 | 0.3 | 0.0 | 67.2 | 0.0 | 31.9 | 0.4 |
| 1050 | 0.0 | 0.0 | 0.2 | 0.1 | 67.3 | 0.0 | 32.0 | 0.3 |
| 1075 | 0.0 | 0.0 | 0.3 | 0.0 | 67.2 | 0.0 | 32.3 | 0.2 |
| 1100 | 0.0 | 0.1 | 0.3 | 0.1 | 67.0 | 0.0 | 32.3 | 0.3 |
| 1125 | 0.1 | 0.0 | 0.2 | 0.1 | 67.3 | 0.0 | 32.1 | 0.2 |
| 1150 | 0.3 | 0.0 | 0.2 | 0.1 | 66.7 | 0.0 | 32.5 | 0.2 |
| 1175 | 0.6 | 0.0 | 0.2 | 0.0 | 67.0 | 0.1 | 31.9 | 0.2 |
| 1200 | 0.2 | 0.0 | 0.3 | 0.0 | 67.3 | 0.0 | 31.9 | 0.3 |
| 1225 | 0.0 | 0.0 | 0.2 | 0.0 | 67.2 | 0.0 | 32.4 | 0.2 |
| 1250 | 0.3 | 0.0 | 0.3 | 0.1 | 67.0 | 0.0 | 32.3 | 0.1 |
| 1275 | 0.0 | 0.1 | 0.2 | 0.0 | 67.3 | 0.0 | 32.3 | 0.2 |
| 1300 | 0.0 | 0.0 | 0.2 | 0.0 | 67.3 | 0.0 | 32.2 | 0.2 |
| 1325 | 0.0 | 0.0 | 0.1 | 0.0 | 67.5 | 0.0 | 32.0 | 0.4 |
| 1350 | 0.2 | 0.0 | 0.1 | 0.0 | 67.4 | 0.0 | 32.2 | 0.2 |
| 1375 | 0.0 | 0.0 | 0.1 | 0.0 | 67.3 | 0.0 | 32.3 | 0.2 |
| 1400 | 0.4 | 0.0 | 0.1 | 0.0 | 67.1 | 0.0 | 32.1 | 0.2 |
| 1425 | 0.0 | 0.0 | 0.1 | 0.0 | 67.6 | 0.1 | 32.1 | 0.1 |
| 1450 | 0.0 | 0.0 | 0.2 | 0.0 | 66.9 | 0.0 | 32.6 | 0.3 |
| 1475 | 0.0 | 0.0 | 0.3 | 0.1 | 67.0 | 0.0 | 32.4 | 0.3 |
| 1500 | 0.0 | 0.0 | 0.1 | 0.0 | 67.1 | 0.0 | 32.6 | 0.2 |
| 1525 | 0.0 | 0.1 | 0.2 | 0.1 | 67.5 | 0.0 | 31.8 | 0.3 |
| 1550 | 0.2 | 0.1 | 0.2 | 0.0 | 67.2 | 0.0 | 32.0 | 0.3 |
| 1575 | 0.4 | 0.1 | 0.2 | 0.0 | 66.8 | 0.0 | 32.3 | 0.2 |
| 1600 | 0.0 | 0.0 | 0.2 | 0.0 | 67.3 | 0.1 | 31.9 | 0.5 |
| 1625 | 0.2 | 0.1 | 0.3 | 0.1 | 67.2 | 0.0 | 32.1 | 0.0 |
| 1650 | 0.1 | 0.0 | 0.1 | 0.0 | 67.3 | 0.1 | 32.2 | 0.2 |
| 1675 | 0.0 | 0.0 | 0.1 | 0.0 | 67.6 | 0.0 | 32.0 | 0.3 |
| 1700 | 0.0 | 0.0 | 0.1 | 0.0 | 67.1 | 0.0 | 32.4 | 0.3 |
| 1725 | 0.0 | 0.0 | 0.2 | 0.1 | 67.6 | 0.0 | 32.1 | 0.1 |
| 1750 | 0.0 | 0.0 | 0.3 | 0.0 | 67.1 | 0.1 | 32.3 | 0.2 |
| 1775 | 0.0 | 0.0 | 0.1 | 0.0 | 67.5 | 0.0 | 32.2 | 0.3 |
| 1800 | 0.0 | 0.1 | 0.1 | 0.0 | 67.2 | 0.0 | 32.5 | 0.2 |
| 1825 | 0.0 | 0.0 | 0.2 | 0.0 | 67.6 | 0.0 | 32.0 | 0.2 |
| 1850 | 0.0 | 0.0 | 0.3 | 0.1 | 67.4 | 0.0 | 32.0 | 0.2 |
| 1875 | 0.2 | 0.0 | 0.2 | 0.0 | 67.1 | 0.0 | 32.1 | 0.3 |

TABLE XIV

| Sputter Depth (Å) | C | Nitrides | Organic N | NO$_2$ | O | Al | SiO$_2$ | Zn |
|---|---|---|---|---|---|---|---|---|
| 0 | 19.1 | 4.2 | 2.1 | 0.1 | 39.9 | 0.4 | 0.0 | 34.3 |
| 25 | 0.0 | 6.4 | 0.0 | 3.8 | 18.4 | 1.3 | 0.0 | 70.1 |
| 50 | 0.0 | 6.4 | 0.0 | 4.5 | 17.0 | 2.3 | 0.0 | 69.8 |
| 75 | 0.0 | 6.4 | 0.0 | 5.0 | 18.1 | 2.9 | 0.0 | 67.7 |
| 100 | 0.2 | 5.8 | 0.0 | 4.5 | 18.6 | 3.4 | 0.0 | 67.5 |
| 125 | 0.0 | 6.1 | 0.0 | 4.7 | 18.4 | 3.4 | 0.0 | 67.5 |
| 150 | 0.0 | 6.1 | 0.0 | 4.7 | 18.3 | 3.2 | 0.0 | 67.6 |
| 175 | 0.2 | 5.9 | 0.0 | 4.8 | 19.0 | 3.3 | 0.0 | 66.9 |
| 200 | 0.6 | 6.3 | 0.0 | 5.1 | 18.5 | 3.8 | 0.8 | 65.0 |
| 225 | 0.0 | 6.1 | 0.0 | 4.8 | 17.8 | 4.0 | 0.0 | 67.2 |
| 250 | 0.2 | 6.1 | 0.0 | 4.7 | 17.5 | 3.7 | 0.4 | 67.5 |
| 275 | 1.1 | 5.8 | 0.0 | 4.9 | 18.9 | 3.8 | 0.0 | 65.5 |
| 300 | 0.0 | 5.8 | 0.0 | 4.7 | 18.5 | 3.6 | 0.0 | 67.4 |
| 325 | 0.0 | 5.8 | 0.0 | 4.7 | 18.1 | 3.7 | 0.6 | 67.2 |
| 350 | 0.0 | 5.9 | 0.0 | 5.0 | 19.3 | 3.7 | 0.0 | 66.0 |
| 375 | 0.0 | 6.3 | 0.0 | 4.9 | 19.3 | 3.7 | 0.0 | 65.8 |
| 400 | 0.6 | 6.2 | 0.0 | 5.1 | 17.2 | 3.8 | 0.0 | 67.1 |
| 425 | 0.0 | 5.9 | 0.0 | 4.9 | 18.9 | 3.5 | 0.0 | 66.9 |
| 450 | 0.0 | 6.1 | 0.0 | 4.6 | 19.6 | 3.7 | 0.3 | 65.7 |
| 475 | 0.0 | 6.0 | 0.0 | 4.9 | 18.1 | 3.6 | 0.5 | 67.0 |
| 500 | 0.0 | 6.1 | 0.0 | 4.8 | 19.5 | 3.9 | 0.3 | 65.4 |
| 525 | 0.7 | 6.1 | 0.0 | 4.9 | 18.6 | 3.7 | 0.4 | 65.6 |
| 550 | 0.0 | 6.2 | 0.0 | 4.8 | 19.3 | 3.6 | 0.8 | 65.3 |
| 575 | 0.7 | 5.8 | 0.0 | 5.0 | 19.8 | 3.9 | 0.3 | 64.7 |
| 600 | 0.1 | 6.3 | 0.0 | 4.7 | 18.2 | 3.7 | 0.0 | 67.0 |
| 625 | 0.0 | 5.8 | 0.0 | 4.7 | 20.0 | 3.9 | 0.0 | 65.6 |
| 650 | 0.5 | 6.1 | 0.0 | 4.7 | 18.8 | 3.5 | 0.6 | 65.8 |
| 675 | 1.4 | 4.5 | 1.2 | 2.6 | 29.8 | 3.2 | 3.2 | 54.2 |
| 700 | 0.8 | 1.5 | 1.5 | 0.8 | 52.4 | 1.9 | 17.2 | 24.0 |
| 725 | 0.4 | 0.3 | 1.1 | 0.3 | 63.2 | 1.1 | 25.1 | 8.6 |
| 750 | 0.6 | 0.1 | 0.5 | 0.1 | 66.6 | 0.4 | 28.8 | 3.0 |
| 775 | 0.0 | 0.0 | 0.2 | 0.0 | 68.2 | 0.2 | 30.4 | 0.9 |
| 800 | 0.5 | 0.1 | 0.1 | 0.0 | 67.8 | 0.2 | 31.0 | 0.4 |
| 825 | 0.2 | 0.1 | 0.1 | 0.0 | 68.0 | 0.1 | 31.5 | 0.2 |
| 850 | 0.0 | 0.0 | 0.1 | 0.0 | 68.3 | 0.0 | 31.4 | 0.2 |
| 875 | 0.0 | 0.1 | 0.0 | 0.0 | 68.3 | 0.0 | 31.3 | 0.2 |
| 900 | 0.0 | 0.0 | 0.2 | 0.1 | 67.7 | 0.1 | 31.7 | 0.3 |
| 925 | 0.3 | 0.0 | 0.1 | 0.0 | 67.5 | 0.0 | 31.9 | 0.1 |
| 950 | 0.4 | 0.0 | 0.0 | 0.0 | 67.7 | 0.0 | 31.7 | 0.2 |
| 975 | 0.1 | 0.0 | 0.0 | 0.0 | 67.9 | 0.0 | 31.9 | 0.1 |
| 1000 | 0.5 | 0.0 | 0.0 | 0.0 | 67.7 | 0.0 | 31.6 | 0.1 |
| 1025 | 0.5 | 0.0 | 0.1 | 0.0 | 67.8 | 0.0 | 31.6 | 0.1 |
| 1050 | 0.2 | 0.0 | 0.1 | 0.0 | 67.8 | 0.0 | 31.7 | 0.2 |
| 1075 | 0.0 | 0.0 | 0.1 | 0.0 | 68.3 | 0.0 | 31.4 | 0.2 |
| 1100 | 0.0 | 0.0 | 0.1 | 0.0 | 68.0 | 0.1 | 31.5 | 0.2 |
| 1125 | 0.0 | 0.0 | 0.0 | 0.0 | 68.2 | 0.0 | 31.7 | 0.1 |
| 1150 | 0.0 | 0.0 | 0.0 | 0.0 | 68.0 | 0.1 | 31.8 | 0.2 |
| 1175 | 0.0 | 0.0 | 0.1 | 0.0 | 68.0 | 0.0 | 31.8 | 0.1 |
| 1200 | 0.2 | 0.0 | 0.1 | 0.0 | 67.8 | 0.0 | 31.8 | 0.2 |
| 1225 | 0.3 | 0.1 | 0.1 | 0.0 | 67.8 | 0.0 | 31.6 | 0.2 |
| 1250 | 0.2 | 0.0 | 0.0 | 0.0 | 68.0 | 0.0 | 31.6 | 0.2 |

Similar to the non-annealed film, Tables XI, XII, and XIII show a natural passivation layer to be formed to a depth of about 25 Angstroms on top of the ternary compound layer. The ternary compound layer has a thickness of about 825 Angstroms to about 850 Angstroms and also has a zinc concentration of about 62 atomic percent to about 68 atomic percent, an oxygen concentration of about 18 atomic percent to about 25 atomic percent, a nitride concentration of about 5.0 atomic percent to about 6.3 atomic percent, and a nitrite concentration of about 3.0 atomic percent to about 4.9 atomic percent for two weeks.

Increasing the flow ratio of nitrogen to oxygen may increase the amount of nitride formed in the ternary compound. Tables XIV, XV, and XVI show the composition of the ternary compound as deposited and after one week respectively for an oxygen to argon to nitrogen flow ratio of 1:12:50 at a temperature of 50 degrees Celsius.

TABLE XV

| Sputter Depth (Å) | C | Nitrides | Organic N | NO$_2$ | O | Al | SiO$_2$ | Zn |
|---|---|---|---|---|---|---|---|---|
| 0 | 22.7 | 0.4 | 1.6 | 0.0 | 43.3 | 0.2 | 0.0 | 31.8 |
| 25 | 0.6 | 2.7 | 0.6 | 0.9 | 34.4 | 0.6 | 0.0 | 60.2 |
| 50 | 0.0 | 4.8 | 0.0 | 2.4 | 25.1 | 0.7 | 0.1 | 66.8 |
| 75 | 0.7 | 5.4 | 0.0 | 3.4 | 19.1 | 1.4 | 0.1 | 69.9 |
| 100 | 0.1 | 6.0 | 0.0 | 4.3 | 17.8 | 2.4 | 0.1 | 69.4 |
| 125 | 0.5 | 6.3 | 0.0 | 4.6 | 17.9 | 2.9 | 0.8 | 67.1 |
| 150 | 0.0 | 6.2 | 0.0 | 4.9 | 17.4 | 3.3 | 0.1 | 68.1 |
| 175 | 0.2 | 6.1 | 0.0 | 4.9 | 17.2 | 3.4 | 0.0 | 68.2 |
| 200 | 0.1 | 6.3 | 0.0 | 4.9 | 18.0 | 3.7 | 0.3 | 66.7 |
| 225 | 0.0 | 6.3 | 0.0 | 4.8 | 17.8 | 3.6 | 0.3 | 67.2 |
| 250 | 1.1 | 5.8 | 0.0 | 4.8 | 17.0 | 3.8 | 0.0 | 67.6 |
| 275 | 0.3 | 6.5 | 0.0 | 4.9 | 16.9 | 3.6 | 0.0 | 67.9 |
| 300 | 0.3 | 6.2 | 0.0 | 5.1 | 17.1 | 3.3 | 0.4 | 67.5 |
| 325 | 0.0 | 6.2 | 0.0 | 4.9 | 18.1 | 3.5 | 0.4 | 66.9 |
| 350 | 0.3 | 6.1 | 0.0 | 4.6 | 17.3 | 3.3 | 0.0 | 68.4 |

TABLE XV-continued

| Sputter Depth (Å) | C | Nitrides | Organic N | NO$_2$ | O | Al | SiO$_2$ | Zn |
|---|---|---|---|---|---|---|---|---|
| 375 | 0.0 | 6.7 | 0.0 | 4.8 | 17.2 | 3.6 | 0.0 | 67.8 |
| 400 | 0.4 | 6.1 | 0.0 | 4.8 | 17.4 | 3.7 | 0.0 | 67.7 |
| 425 | 1.1 | 5.9 | 0.0 | 4.9 | 18.5 | 3.7 | 0.0 | 66.1 |
| 450 | 0.0 | 6.0 | 0.0 | 4.9 | 18.4 | 3.5 | 0.1 | 67.1 |
| 475 | 0.4 | 6.1 | 0.0 | 4.8 | 17.6 | 3.5 | 0.7 | 66.9 |
| 500 | 0.6 | 6.2 | 0.0 | 4.5 | 18.8 | 3.4 | 0.2 | 66.4 |
| 525 | 0.0 | 5.7 | 0.0 | 4.8 | 17.7 | 3.5 | 0.0 | 68.3 |
| 550 | 0.2 | 6.0 | 0.0 | 5.0 | 18.7 | 3.6 | 0.2 | 66.4 |
| 575 | 0.2 | 6.4 | 0.0 | 4.9 | 18.5 | 3.4 | 0.0 | 66.6 |
| 600 | 0.5 | 6.2 | 0.0 | 4.9 | 18.1 | 3.5 | 0.0 | 66.8 |
| 625 | 0.2 | 5.9 | 0.0 | 5.0 | 18.3 | 3.5 | 0.3 | 66.8 |
| 650 | 0.1 | 6.7 | 0.0 | 5.0 | 17.7 | 3.4 | 0.4 | 66.9 |
| 675 | 0.0 | 6.0 | 0.0 | 4.9 | 19.5 | 3.5 | 0.0 | 66.2 |
| 700 | 1.2 | 5.8 | 0.0 | 3.9 | 21.5 | 3.5 | 1.5 | 62.7 |
| 725 | 0.7 | 3.3 | 1.1 | 1.8 | 38.8 | 2.9 | 9.9 | 41.7 |
| 750 | 0.1 | 1.4 | 1.1 | 0.7 | 54.6 | 1.6 | 21.1 | 19.4 |
| 775 | 0.0 | 0.6 | 0.7 | 0.3 | 62.7 | 1.0 | 26.6 | 8.2 |
| 800 | 0.2 | 0.1 | 0.4 | 0.1 | 65.4 | 0.5 | 30.0 | 3.3 |
| 825 | 0.2 | 0.1 | 0.3 | 0.1 | 66.8 | 0.2 | 31.2 | 1.2 |
| 850 | 0.3 | 0.1 | 0.1 | 0.0 | 67.1 | 0.1 | 31.9 | 0.5 |
| 875 | 0.0 | 0.0 | 0.0 | 0.0 | 67.8 | 0.0 | 31.9 | 0.3 |
| 900 | 0.1 | 0.1 | 0.1 | 0.0 | 66.9 | 0.0 | 32.6 | 0.2 |
| 925 | 0.2 | 0.0 | 0.1 | 0.0 | 67.1 | 0.0 | 32.4 | 0.2 |
| 950 | 0.0 | 0.0 | 0.1 | 0.1 | 66.9 | 0.1 | 32.5 | 0.4 |
| 975 | 0.2 | 0.0 | 0.0 | 0.0 | 67.0 | 0.0 | 32.5 | 0.2 |
| 1000 | 0.4 | 0.2 | 0.1 | 0.0 | 66.9 | 0.1 | 32.2 | 0.1 |
| 1025 | 0.0 | 0.0 | 0.1 | 0.0 | 67.3 | 0.0 | 32.4 | 0.2 |
| 1050 | 0.1 | 0.1 | 0.1 | 0.0 | 66.9 | 0.1 | 32.6 | 0.1 |
| 1075 | 0.1 | 0.0 | 0.0 | 0.0 | 67.0 | 0.0 | 32.6 | 0.3 |
| 1100 | 0.1 | 0.0 | 0.0 | 0.0 | 67.2 | 0.0 | 32.5 | 0.1 |
| 1125 | 0.2 | 0.0 | 0.0 | 0.0 | 67.0 | 0.1 | 32.4 | 0.2 |
| 1150 | 0.3 | 0.0 | 0.0 | 0.0 | 66.9 | 0.0 | 32.5 | 0.3 |
| 1175 | 0.0 | 0.0 | 0.1 | 0.0 | 67.1 | 0.0 | 32.6 | 0.2 |
| 1200 | 0.2 | 0.0 | 0.1 | 0.0 | 67.1 | 0.0 | 32.5 | 0.1 |
| 1225 | 0.0 | 0.0 | 0.0 | 0.0 | 67.5 | 0.0 | 32.2 | 0.3 |
| 1250 | 0.1 | 0.0 | 0.1 | 0.0 | 67.0 | 0.0 | 32.7 | 0.1 |
| 1275 | 0.0 | 0.0 | 0.1 | 0.1 | 66.9 | 0.0 | 32.8 | 0.1 |
| 1300 | 0.4 | 0.1 | 0.1 | 0.0 | 66.8 | 0.0 | 32.5 | 0.2 |
| 1325 | 0.0 | 0.0 | 0.0 | 0.0 | 67.4 | 0.1 | 32.3 | 0.2 |
| 1350 | 0.3 | 0.0 | 0.0 | 0.0 | 66.8 | 0.0 | 32.6 | 0.3 |
| 1375 | 0.0 | 0.1 | 0.1 | 0.0 | 67.2 | 0.1 | 32.5 | 0.1 |
| 1400 | 0.3 | 0.1 | 0.0 | 0.0 | 67.3 | 0.0 | 32.2 | 0.1 |
| 1425 | 0.0 | 0.0 | 0.0 | 0.0 | 67.1 | 0.1 | 32.5 | 0.2 |
| 1450 | 0.1 | 0.0 | 0.0 | 0.0 | 67.2 | 0.0 | 32.6 | 0.2 |
| 1475 | 0.0 | 0.0 | 0.0 | 0.0 | 67.3 | 0.0 | 32.5 | 0.1 |
| 1500 | 0.2 | 0.0 | 0.1 | 0.0 | 67.3 | 0.1 | 32.2 | 0.1 |

TABLE XVI

| Sputter Depth (Å) | C | Nitrides | Organic N | NO$_2$ | O | Al | SiO$_2$ | Zn |
|---|---|---|---|---|---|---|---|---|
| 0 | 21.3 | 0.0 | 0.6 | 0.0 | 44.7 | 0.3 | 0.4 | 32.7 |
| 25 | 1.4 | 0.0 | 0.2 | 0.0 | 42.4 | 0.6 | 0.0 | 55.4 |
| 50 | 0.7 | 0.0 | 0.2 | 0.0 | 41.6 | 0.4 | 0.0 | 57.0 |
| 75 | 1.2 | 0.0 | 0.2 | 0.0 | 40.8 | 0.6 | 0.2 | 57.1 |
| 100 | 0.6 | 0.1 | 0.2 | 0.0 | 41.5 | 0.6 | 0.0 | 57.0 |
| 125 | 0.6 | 0.1 | 0.1 | 0.0 | 42.2 | 0.6 | 0.0 | 56.4 |
| 150 | 0.1 | 0.0 | 0.1 | 0.0 | 41.2 | 0.7 | 0.3 | 57.8 |
| 175 | 0.3 | 0.0 | 0.2 | 0.0 | 41.1 | 0.5 | 0.1 | 57.8 |
| 200 | 0.2 | 0.1 | 0.2 | 0.0 | 41.7 | 0.5 | 0.0 | 57.4 |
| 225 | 0.0 | 0.1 | 0.2 | 0.0 | 41.2 | 0.7 | 0.2 | 57.6 |
| 250 | 0.4 | 0.2 | 0.2 | 0.0 | 40.8 | 0.7 | 0.0 | 57.8 |
| 275 | 1.3 | 0.0 | 0.2 | 0.0 | 40.4 | 0.7 | 0.0 | 57.4 |
| 300 | 0.3 | 0.0 | 0.1 | 0.0 | 41.0 | 0.7 | 0.0 | 57.9 |
| 325 | 0.3 | 0.1 | 0.3 | 0.1 | 41.5 | 0.6 | 0.0 | 57.2 |
| 350 | 0.3 | 0.4 | 0.3 | 0.1 | 40.0 | 0.7 | 0.3 | 58.0 |
| 375 | 0.0 | 0.6 | 0.2 | 0.2 | 39.0 | 0.8 | 0.0 | 59.2 |
| 400 | 0.9 | 1.3 | 0.3 | 0.4 | 37.1 | 0.8 | 0.4 | 58.8 |
| 425 | 0.6 | 1.3 | 0.3 | 0.6 | 36.0 | 1.0 | 0.1 | 60.3 |
| 450 | 0.6 | 2.0 | 0.2 | 1.0 | 34.1 | 1.2 | 0.2 | 60.9 |
| 475 | 1.3 | 2.5 | 0.3 | 1.4 | 30.7 | 1.1 | 0.1 | 62.8 |
| 500 | 0.4 | 3.4 | 0.0 | 1.8 | 28.0 | 1.7 | 0.7 | 64.0 |
| 525 | 0.1 | 4.1 | 0.0 | 2.3 | 26.0 | 1.8 | 1.0 | 64.7 |
| 550 | 0.5 | 4.3 | 0.0 | 2.7 | 24.4 | 2.1 | 0.6 | 65.4 |
| 575 | 0.3 | 5.2 | 0.0 | 3.4 | 21.6 | 2.6 | 0.8 | 66.2 |
| 600 | 0.9 | 5.7 | 0.0 | 3.5 | 20.5 | 2.9 | 0.2 | 66.3 |
| 625 | 0.4 | 5.7 | 0.0 | 4.0 | 20.0 | 3.1 | 0.5 | 66.3 |
| 650 | 0.1 | 6.0 | 0.0 | 4.2 | 18.8 | 3.2 | 0.6 | 67.0 |
| 675 | 0.0 | 6.1 | 0.0 | 4.3 | 18.2 | 3.6 | 0.8 | 67.1 |
| 700 | 0.1 | 6.3 | 0.0 | 4.4 | 18.7 | 3.6 | 0.4 | 66.5 |
| 725 | 0.1 | 6.2 | 0.0 | 4.4 | 17.4 | 3.7 | 0.2 | 68.0 |
| 750 | 0.0 | 6.3 | 0.0 | 4.5 | 17.7 | 3.6 | 1.1 | 66.7 |
| 775 | 0.0 | 6.3 | 0.0 | 4.5 | 19.3 | 3.4 | 0.7 | 65.8 |
| 800 | 0.6 | 6.2 | 0.0 | 4.1 | 19.0 | 3.7 | 0.8 | 65.6 |
| 825 | 0.4 | 6.3 | 0.0 | 4.3 | 17.9 | 3.4 | 0.8 | 66.8 |
| 850 | 0.0 | 6.3 | 0.0 | 4.2 | 19.2 | 3.5 | 1.0 | 65.8 |
| 875 | 0.0 | 6.1 | 0.0 | 4.2 | 19.5 | 3.5 | 1.0 | 65.7 |
| 900 | 0.0 | 6.4 | 0.0 | 4.4 | 18.2 | 3.9 | 1.1 | 66.0 |
| 925 | 0.0 | 6.3 | 0.0 | 4.6 | 19.2 | 3.8 | 0.9 | 65.2 |
| 950 | 0.2 | 6.5 | 0.0 | 4.1 | 20.0 | 3.8 | 1.3 | 64.1 |
| 975 | 0.5 | 6.3 | 0.0 | 3.8 | 21.6 | 3.6 | 2.0 | 62.2 |
| 1000 | 0.0 | 5.9 | 0.0 | 3.7 | 25.7 | 3.2 | 4.3 | 57.2 |
| 1025 | 0.3 | 5.0 | 0.0 | 2.9 | 32.0 | 3.0 | 7.6 | 49.3 |
| 1050 | 0.3 | 4.1 | 0.0 | 2.1 | 38.9 | 2.4 | 12.4 | 39.9 |
| 1075 | 0.8 | 3.3 | 0.0 | 1.5 | 46.1 | 1.9 | 17.2 | 29.3 |
| 1100 | 0.6 | 1.9 | 0.3 | 0.9 | 53.3 | 1.4 | 21.2 | 20.5 |
| 1125 | 0.4 | 1.5 | 0.3 | 0.6 | 58.3 | 1.0 | 24.8 | 13.2 |
| 1150 | 0.2 | 0.9 | 0.4 | 0.4 | 61.6 | 0.7 | 27.7 | 8.1 |
| 1175 | 0.7 | 0.3 | 0.5 | 0.2 | 64.3 | 0.3 | 29.0 | 4.8 |
| 1200 | 0.1 | 0.4 | 0.2 | 0.1 | 65.9 | 0.2 | 30.5 | 2.7 |
| 1225 | 0.0 | 0.2 | 0.3 | 0.1 | 66.6 | 0.1 | 31.1 | 1.5 |
| 1250 | 0.0 | 0.1 | 0.3 | 0.1 | 67.1 | 0.1 | 31.7 | 0.9 |
| 1275 | 0.5 | 0.0 | 0.2 | 0.0 | 67.2 | 0.0 | 31.8 | 0.3 |
| 1300 | 0.5 | 0.1 | 0.2 | 0.0 | 67.2 | 0.1 | 31.8 | 0.2 |
| 1325 | 0.1 | 0.0 | 0.1 | 0.0 | 67.6 | 0.0 | 31.9 | 0.2 |
| 1350 | 0.1 | 0.0 | 0.2 | 0.0 | 67.3 | 0.0 | 32.2 | 0.1 |
| 1375 | 0.3 | 0.0 | 0.3 | 0.0 | 67.5 | 0.0 | 32.0 | 0.0 |
| 1400 | 0.0 | 0.0 | 0.2 | 0.0 | 67.8 | 0.0 | 31.9 | 0.0 |
| 1425 | 0.2 | 0.0 | 0.2 | 0.0 | 67.6 | 0.1 | 31.9 | 0.1 |
| 1450 | 0.1 | 0.0 | 0.2 | 0.0 | 67.7 | 0.0 | 31.9 | 0.0 |
| 1475 | 0.1 | 0.0 | 0.1 | 0.0 | 67.7 | 0.0 | 32.0 | 0.1 |
| 1500 | 0.0 | 0.0 | 0.1 | 0.0 | 67.9 | 0.0 | 31.9 | 0.0 |
| 1525 | 0.0 | 0.0 | 0.1 | 0.0 | 67.6 | 0.1 | 32.0 | 0.2 |
| 1550 | 0.4 | 0.0 | 0.2 | 0.0 | 67.6 | 0.0 | 31.8 | 0.0 |
| 1575 | 0.0 | 0.0 | 0.2 | 0.1 | 67.7 | 0.0 | 31.9 | 0.1 |
| 1600 | 0.1 | 0.0 | 0.1 | 0.0 | 67.7 | 0.0 | 31.9 | 0.1 |
| 1625 | 0.0 | 0.0 | 0.1 | 0.0 | 67.9 | 0.0 | 32.0 | 0.1 |
| 1650 | 0.1 | 0.1 | 0.3 | 0.1 | 67.7 | 0.0 | 31.9 | 0.0 |
| 1675 | 0.0 | 0.0 | 0.2 | 0.0 | 67.5 | 0.0 | 32.3 | 0.0 |
| 1700 | 0.0 | 0.0 | 0.2 | 0.0 | 67.4 | 0.1 | 32.3 | 0.1 |
| 1725 | 0.1 | 0.0 | 0.2 | 0.0 | 67.8 | 0.0 | 31.9 | 0.0 |
| 1750 | 0.3 | 0.0 | 0.1 | 0.0 | 67.4 | 0.0 | 32.1 | 0.1 |
| 1775 | 0.2 | 0.1 | 0.3 | 0.0 | 67.6 | 0.0 | 31.6 | 0.2 |
| 1800 | 0.0 | 0.0 | 0.2 | 0.0 | 67.9 | 0.0 | 31.8 | 0.1 |
| 1825 | 0.2 | 0.0 | 0.2 | 0.0 | 67.5 | 0.0 | 32.0 | 0.0 |
| 1850 | 0.4 | 0.1 | 0.3 | 0.1 | 67.3 | 0.0 | 31.8 | 0.1 |
| 1875 | 0.0 | 0.0 | 0.2 | 0.1 | 67.7 | 0.0 | 32.1 | 0.0 |

As may be seen from Tables XIV, XV, and XVI, a natural passivation layer forms to a depth of about 25 Angstroms on top of the ternary compound layer. The ternary compound layer has a thickness of about 700 Angstroms to about 750 Angstroms and also has a zinc concentration of about 65 atomic percent to about 70 atomic percent, an oxygen concentration of about 17 atomic percent to about 20 atomic percent, a nitride concentration of about 5.7 atomic percent to about 6.4 atomic percent, and a nitrite concentration of about 3.4 atomic percent to about 5.1 atomic percent after one week. After two weeks, the zinc concentration changes to about 55 atomic percent to about 68 atomic percent, the oxygen concentration changes to about 17 atomic percent to about 42 atomic percent, the nitride concentration changes to about 0.4 atomic percent to about 6.4 atomic percent, and the nitrite concentration changes to about 0.2 atomic percent to about 4.5 atomic percent.

When the film is annealed, the composition of the film remains substantially the same as the non-annealed film. Tables XVII, XVIII, and XIX show the composition of the annealed ternary compound of Tables XIV, XV, and XVI respectively.

TABLE XVII

| Sputter Depth (Å) | C | Nitrides | Organic N | NO$_2$ | O | Al | SiO$_2$ | Zn |
|---|---|---|---|---|---|---|---|---|
| 0 | 18.5 | 8.8 | 0.6 | 0.3 | 31.8 | 0.8 | 0.0 | 39.1 |
| 25 | 0.0 | 6.0 | 0.2 | 4.0 | 15.7 | 1.8 | 0.0 | 72.3 |
| 50 | 0.2 | 6.2 | 0.0 | 4.5 | 16.3 | 2.8 | 0.0 | 70.1 |
| 75 | 0.0 | 6.1 | 0.1 | 4.8 | 16.9 | 2.9 | 0.6 | 68.6 |
| 100 | 0.3 | 5.9 | 0.2 | 4.7 | 17.4 | 3.3 | 0.4 | 67.9 |
| 125 | 0.0 | 6.0 | 0.2 | 4.9 | 16.5 | 3.4 | 0.0 | 69.1 |
| 150 | 0.0 | 6.3 | 0.0 | 5.1 | 16.3 | 3.3 | 0.0 | 69.1 |
| 175 | 0.0 | 6.2 | 0.0 | 5.0 | 18.3 | 3.2 | 0.0 | 67.3 |
| 200 | 0.0 | 6.3 | 0.0 | 5.1 | 16.8 | 3.5 | 0.0 | 68.3 |
| 225 | 0.0 | 6.0 | 0.0 | 5.2 | 17.3 | 3.6 | 0.0 | 67.9 |
| 250 | 0.2 | 6.0 | 0.0 | 5.1 | 18.2 | 3.8 | 0.1 | 66.7 |
| 275 | 0.0 | 6.0 | 0.0 | 5.1 | 18.1 | 3.8 | 0.4 | 66.7 |
| 300 | 0.0 | 5.9 | 0.1 | 5.6 | 18.2 | 3.5 | 0.0 | 66.8 |
| 325 | 0.8 | 6.1 | 0.0 | 5.4 | 17.6 | 3.6 | 0.0 | 66.7 |
| 350 | 0.0 | 6.1 | 0.0 | 5.3 | 18.8 | 3.6 | 0.2 | 66.0 |
| 375 | 0.4 | 6.3 | 0.0 | 5.3 | 17.7 | 3.7 | 0.0 | 66.6 |
| 400 | 0.0 | 6.2 | 0.0 | 5.4 | 17.6 | 3.6 | 0.3 | 67.0 |
| 425 | 0.5 | 6.0 | 0.0 | 5.2 | 18.6 | 3.4 | 0.8 | 65.5 |
| 450 | 0.0 | 6.2 | 0.2 | 5.5 | 17.8 | 3.5 | 0.0 | 66.9 |
| 475 | 1.1 | 6.0 | 0.1 | 5.3 | 18.5 | 3.6 | 0.0 | 65.4 |
| 500 | 1.0 | 6.1 | 0.1 | 5.3 | 18.2 | 3.6 | 0.0 | 65.7 |
| 525 | 0.0 | 6.1 | 0.1 | 5.4 | 17.9 | 4.1 | 0.0 | 66.3 |
| 550 | 0.0 | 5.9 | 0.0 | 5.2 | 18.5 | 3.7 | 0.3 | 66.5 |
| 575 | 0.4 | 5.9 | 0.5 | 5.6 | 18.6 | 3.5 | 0.0 | 65.6 |
| 600 | 0.0 | 5.9 | 0.2 | 5.5 | 19.2 | 3.5 | 0.5 | 65.2 |
| 625 | 0.0 | 5.8 | 0.2 | 5.0 | 19.3 | 3.7 | 0.3 | 65.8 |
| 650 | 0.1 | 5.6 | 0.3 | 5.2 | 19.9 | 3.6 | 0.2 | 65.0 |
| 675 | 1.3 | 4.2 | 1.4 | 3.2 | 27.8 | 3.3 | 2.2 | 56.7 |
| 700 | 0.4 | 1.6 | 1.2 | 1.0 | 50.4 | 2.0 | 15.6 | 27.9 |
| 725 | 0.0 | 0.6 | 0.8 | 0.5 | 61.1 | 1.0 | 25.6 | 10.4 |
| 750 | 0.0 | 0.3 | 0.4 | 0.2 | 66.0 | 0.4 | 29.0 | 3.7 |
| 775 | 0.0 | 0.1 | 0.3 | 0.1 | 67.4 | 0.2 | 30.7 | 1.3 |
| 800 | 0.0 | 0.0 | 0.2 | 0.0 | 67.6 | 0.1 | 31.6 | 0.5 |
| 825 | 0.4 | 0.0 | 0.1 | 0.0 | 67.3 | 0.1 | 32.0 | 0.1 |
| 850 | 0.0 | 0.0 | 0.1 | 0.0 | 67.5 | 0.1 | 32.2 | 0.1 |
| 875 | 0.4 | 0.1 | 0.1 | 0.0 | 67.2 | 0.1 | 32.0 | 0.0 |

TABLE XVIII

| Sputter Depth (Å) | C | Nitrides | Organic N | NO$_2$ | O | Al | SiO$_2$ | Zn |
|---|---|---|---|---|---|---|---|---|
| 0 | 24.7 | 6.8 | 1.6 | 0.3 | 32.9 | 0.4 | 0.0 | 33.4 |
| 25 | 0.0 | 6.3 | 0.0 | 3.8 | 16.2 | 1.5 | 0.8 | 71.4 |
| 50 | 0.0 | 6.6 | 0.0 | 4.3 | 18.0 | 2.7 | 0.3 | 68.2 |
| 75 | 0.0 | 6.2 | 0.0 | 4.7 | 16.6 | 3.0 | 0.4 | 69.0 |
| 100 | 0.1 | 6.3 | 0.0 | 4.6 | 17.8 | 3.3 | 0.3 | 67.6 |
| 125 | 0.1 | 6.2 | 0.0 | 4.6 | 18.0 | 3.2 | 0.7 | 67.2 |
| 150 | 0.2 | 6.1 | 0.0 | 5.1 | 17.1 | 3.4 | 0.6 | 67.7 |
| 175 | 0.0 | 6.2 | 0.0 | 4.7 | 17.7 | 3.4 | 0.8 | 67.2 |
| 200 | 0.0 | 6.0 | 0.1 | 4.9 | 17.4 | 3.5 | 0.0 | 68.2 |
| 225 | 0.7 | 6.1 | 0.0 | 4.6 | 18.0 | 3.9 | 0.9 | 65.8 |
| 250 | 0.5 | 6.1 | 0.0 | 4.6 | 18.3 | 3.5 | 0.0 | 67.0 |
| 275 | 0.0 | 5.9 | 0.0 | 4.9 | 18.3 | 3.8 | 0.4 | 66.7 |
| 300 | 0.2 | 6.2 | 0.0 | 5.0 | 18.7 | 3.8 | 0.0 | 66.1 |
| 325 | 0.0 | 5.9 | 0.0 | 4.8 | 18.6 | 3.5 | 0.0 | 67.2 |
| 350 | 0.3 | 5.9 | 0.0 | 4.9 | 18.3 | 3.8 | 0.1 | 66.7 |
| 375 | 0.2 | 5.7 | 0.0 | 4.6 | 19.0 | 3.6 | 0.4 | 66.5 |
| 400 | 0.1 | 6.0 | 0.0 | 4.8 | 18.3 | 4.0 | 0.5 | 66.4 |
| 425 | 0.0 | 6.2 | 0.0 | 4.9 | 18.7 | 3.8 | 0.4 | 65.9 |
| 450 | 0.0 | 5.9 | 0.0 | 4.7 | 18.7 | 3.9 | 0.3 | 66.4 |
| 475 | 0.1 | 6.2 | 0.0 | 4.8 | 18.2 | 3.9 | 0.4 | 66.5 |
| 500 | 0.3 | 6.4 | 0.0 | 4.6 | 18.2 | 3.5 | 0.4 | 66.7 |
| 525 | 0.0 | 6.1 | 0.0 | 4.6 | 19.3 | 3.9 | 0.0 | 66.1 |
| 550 | 0.3 | 6.1 | 0.0 | 4.7 | 19.6 | 3.8 | 0.0 | 65.4 |
| 575 | 0.0 | 6.1 | 0.0 | 4.5 | 19.1 | 3.8 | 0.5 | 66.1 |
| 600 | 0.0 | 6.2 | 0.0 | 4.6 | 18.5 | 4.1 | 0.0 | 66.7 |
| 625 | 0.7 | 6.3 | 0.0 | 4.8 | 18.3 | 3.6 | 0.0 | 66.3 |
| 650 | 0.2 | 5.8 | 0.2 | 4.7 | 19.4 | 3.7 | 0.9 | 65.1 |
| 675 | 0.0 | 6.2 | 0.0 | 4.5 | 20.4 | 3.5 | 0.7 | 64.7 |
| 700 | 0.6 | 4.4 | 0.9 | 2.5 | 31.0 | 3.1 | 3.9 | 53.7 |
| 725 | 0.5 | 2.1 | 0.6 | 0.9 | 52.0 | 1.9 | 17.1 | 25.0 |
| 750 | 0.2 | 0.4 | 1.1 | 0.4 | 61.8 | 0.9 | 25.4 | 9.8 |
| 775 | 0.6 | 0.4 | 0.4 | 0.1 | 65.1 | 0.5 | 29.0 | 3.8 |
| 800 | 0.0 | 0.1 | 0.3 | 0.0 | 67.5 | 0.3 | 30.5 | 1.2 |
| 825 | 0.0 | 0.1 | 0.1 | 0.0 | 67.7 | 0.2 | 31.5 | 0.4 |
| 850 | 0.2 | 0.0 | 0.2 | 0.0 | 67.9 | 0.1 | 31.4 | 0.1 |
| 875 | 0.0 | 0.0 | 0.1 | 0.1 | 67.7 | 0.1 | 32.1 | 0.0 |
| 900 | 0.0 | 0.0 | 0.0 | 0.0 | 68.0 | 0.1 | 31.9 | 0.1 |
| 925 | 0.1 | 0.0 | 0.1 | 0.1 | 67.4 | 0.1 | 32.2 | 0.0 |
| 950 | 0.0 | 0.1 | 0.1 | 0.0 | 68.2 | 0.0 | 31.6 | 0.0 |
| 975 | 0.0 | 0.1 | 0.1 | 0.0 | 67.7 | 0.0 | 32.2 | 0.0 |
| 1000 | 0.3 | 0.0 | 0.0 | 0.0 | 67.7 | 0.0 | 32.0 | 0.0 |
| 1025 | 0.0 | 0.0 | 0.1 | 0.1 | 67.8 | 0.0 | 32.1 | 0.0 |
| 1050 | 0.0 | 0.0 | 0.1 | 0.0 | 67.8 | 0.0 | 32.2 | 0.0 |
| 1075 | 0.0 | 0.0 | 0.1 | 0.0 | 67.9 | 0.1 | 32.0 | 0.0 |
| 1100 | 0.0 | 0.0 | 0.1 | 0.0 | 67.8 | 0.0 | 32.1 | 0.0 |
| 1125 | 0.1 | 0.0 | 0.1 | 0.0 | 68.0 | 0.1 | 31.8 | 0.0 |
| 1150 | 0.0 | 0.0 | 0.1 | 0.0 | 67.6 | 0.0 | 32.3 | 0.0 |
| 1175 | 0.2 | 0.0 | 0.1 | 0.0 | 67.5 | 0.1 | 32.1 | 0.0 |
| 1200 | 0.2 | 0.1 | 0.1 | 0.0 | 67.9 | 0.0 | 31.8 | 0.0 |
| 1225 | 0.0 | 0.0 | 0.1 | 0.1 | 67.5 | 0.0 | 32.3 | 0.0 |
| 1250 | 0.3 | 0.0 | 0.1 | 0.0 | 67.9 | 0.0 | 31.8 | 0.0 |
| 1275 | 0.0 | 0.1 | 0.1 | 0.0 | 67.9 | 0.0 | 32.0 | 0.0 |
| 1300 | 0.0 | 0.0 | 0.1 | 0.0 | 67.9 | 0.0 | 31.9 | 0.0 |
| 1325 | 0.0 | 0.0 | 0.1 | 0.0 | 67.7 | 0.0 | 32.2 | 0.0 |
| 1350 | 0.0 | 0.0 | 0.1 | 0.0 | 67.7 | 0.0 | 32.2 | 0.0 |
| 1375 | 0.1 | 0.0 | 0.1 | 0.0 | 67.6 | 0.1 | 32.1 | 0.0 |
| 1400 | 0.0 | 0.0 | 0.1 | 0.0 | 67.5 | 0.0 | 32.3 | 0.1 |
| 1425 | 0.0 | 0.0 | 0.1 | 0.0 | 68.1 | 0.0 | 31.8 | 0.0 |
| 1450 | 0.0 | 0.0 | 0.1 | 0.0 | 68.1 | 0.0 | 31.9 | 0.0 |
| 1475 | 0.3 | 0.0 | 0.1 | 0.0 | 67.5 | 0.0 | 32.0 | 0.2 |
| 1500 | 0.1 | 0.0 | 0.1 | 0.0 | 68.0 | 0.0 | 31.8 | 0.0 |

TABLE XIX

| Sputter Depth (Å) | C | Nitrides | Organic N | NO$_2$ | O | Al | SiO$_2$ | Zn |
|---|---|---|---|---|---|---|---|---|
| 0 | 22.3 | 6.8 | 1.1 | 0.0 | 33.0 | 0.5 | 0.0 | 36.3 |
| 25 | 0.0 | 6.2 | 0.0 | 3.8 | 17.2 | 1.1 | 0.4 | 71.4 |
| 50 | 0.0 | 6.1 | 0.0 | 4.3 | 16.0 | 2.3 | 0.3 | 71.0 |
| 75 | 0.0 | 6.1 | 0.0 | 4.7 | 16.4 | 2.7 | 0.2 | 69.9 |
| 100 | 0.1 | 6.1 | 0.0 | 4.7 | 16.5 | 3.2 | 0.2 | 69.3 |
| 125 | 1.1 | 6.0 | 0.0 | 4.7 | 15.6 | 3.1 | 0.0 | 69.7 |
| 150 | 0.0 | 6.1 | 0.0 | 5.0 | 16.3 | 3.4 | 0.1 | 69.1 |
| 175 | 0.1 | 5.9 | 0.0 | 5.0 | 17.8 | 3.4 | 0.3 | 67.5 |
| 200 | 0.0 | 6.2 | 0.2 | 5.3 | 16.6 | 3.3 | 0.0 | 68.4 |
| 225 | 0.0 | 5.9 | 0.0 | 4.5 | 17.4 | 3.6 | 0.2 | 68.4 |
| 250 | 0.0 | 6.1 | 0.2 | 4.8 | 17.6 | 3.6 | 0.6 | 67.2 |
| 275 | 0.0 | 5.8 | 0.0 | 5.1 | 18.8 | 3.4 | 0.1 | 66.8 |
| 300 | 0.1 | 5.7 | 0.0 | 5.1 | 17.8 | 3.5 | 0.3 | 67.6 |
| 325 | 0.2 | 5.9 | 0.0 | 5.1 | 18.1 | 3.6 | 0.0 | 67.1 |
| 350 | 0.0 | 6.0 | 0.0 | 4.6 | 18.2 | 3.6 | 0.0 | 67.7 |
| 375 | 0.0 | 6.1 | 0.0 | 5.2 | 17.2 | 3.8 | 0.0 | 67.8 |
| 400 | 0.2 | 6.1 | 0.0 | 5.0 | 17.3 | 3.2 | 0.1 | 68.0 |
| 425 | 0.4 | 6.0 | 0.0 | 5.1 | 17.5 | 3.5 | 0.5 | 66.9 |
| 450 | 0.4 | 5.9 | 0.0 | 4.7 | 18.7 | 3.3 | 0.3 | 66.8 |
| 475 | 0.0 | 5.9 | 0.0 | 4.8 | 18.2 | 3.7 | 0.4 | 67.0 |
| 500 | 0.0 | 6.3 | 0.0 | 4.9 | 17.6 | 3.7 | 0.4 | 67.2 |
| 525 | 0.0 | 6.0 | 0.0 | 4.9 | 18.4 | 3.5 | 0.3 | 66.9 |
| 550 | 0.7 | 6.0 | 0.0 | 4.9 | 18.6 | 3.5 | 0.4 | 65.9 |
| 575 | 0.1 | 6.0 | 0.0 | 4.7 | 19.1 | 3.7 | 0.0 | 66.5 |

TABLE XIX-continued

| Sputter Depth (Å) | C | Nitrides | Organic N | NO$_2$ | O | Al | SiO$_2$ | Zn |
|---|---|---|---|---|---|---|---|---|
| 600 | 0.0 | 5.9 | 0.1 | 5.0 | 18.7 | 3.5 | 0.2 | 66.7 |
| 625 | 0.0 | 6.2 | 0.0 | 4.7 | 18.0 | 3.5 | 0.4 | 67.2 |
| 650 | 0.0 | 6.0 | 0.0 | 4.7 | 19.8 | 3.6 | 0.2 | 65.7 |
| 675 | 0.6 | 5.9 | 0.0 | 4.2 | 19.7 | 3.3 | 0.8 | 65.5 |
| 700 | 1.1 | 4.3 | 0.0 | 1.6 | 36.3 | 2.6 | 6.6 | 47.5 |
| 725 | 0.3 | 2.5 | 0.0 | 0.5 | 55.6 | 1.6 | 20.0 | 19.5 |
| 750 | 0.3 | 1.1 | 0.0 | 0.1 | 63.7 | 0.9 | 26.9 | 7.0 |
| 775 | 0.0 | 0.7 | 0.2 | 0.0 | 66.1 | 0.5 | 30.1 | 2.5 |
| 800 | 0.0 | 0.4 | 0.1 | 0.0 | 67.2 | 0.2 | 31.3 | 0.7 |
| 825 | 0.2 | 0.1 | 0.3 | 0.1 | 67.1 | 0.1 | 31.9 | 0.4 |
| 850 | 0.0 | 0.0 | 0.2 | 0.1 | 67.5 | 0.1 | 31.8 | 0.3 |
| 875 | 0.2 | 0.0 | 0.2 | 0.0 | 66.9 | 0.1 | 32.3 | 0.4 |
| 900 | 0.0 | 0.0 | 0.2 | 0.0 | 67.2 | 0.1 | 32.2 | 0.3 |
| 925 | 0.0 | 0.1 | 0.2 | 0.0 | 67.4 | 0.0 | 32.2 | 0.1 |
| 950 | 0.3 | 0.1 | 0.3 | 0.1 | 67.0 | 0.0 | 32.0 | 0.2 |
| 975 | 0.0 | 0.0 | 0.1 | 0.0 | 67.4 | 0.1 | 32.3 | 0.2 |
| 1000 | 0.1 | 0.0 | 0.2 | 0.0 | 67.5 | 0.1 | 32.1 | 0.1 |
| 1025 | 0.3 | 0.0 | 0.1 | 0.0 | 67.5 | 0.0 | 31.8 | 0.2 |
| 1050 | 0.0 | 0.0 | 0.2 | 0.0 | 67.5 | 0.0 | 32.2 | 0.1 |
| 1075 | 0.7 | 0.0 | 0.0 | 0.0 | 67.0 | 0.0 | 32.1 | 0.2 |
| 1100 | 0.1 | 0.1 | 0.1 | 0.0 | 67.0 | 0.0 | 32.4 | 0.2 |
| 1125 | 0.0 | 0.0 | 0.1 | 0.0 | 67.4 | 0.0 | 32.3 | 0.1 |

As may be seen from Tables XVII, XVIII, and XIX, a natural passivation layer forms to a depth of about 25 Angstroms to about 50 Angstroms on top of the ternary compound layer. The ternary compound layer has a thickness of about 700 Angstroms to about 725 Angstroms and also has a zinc concentration of about 65 atomic percent to about 72 atomic percent, an oxygen concentration of about 16 atomic percent to about 20 atomic percent, a nitride concentration of about 5.6 atomic percent to about 6.6 atomic percent, and a nitrite concentration of about 3.8 atomic percent to about 5.6 atomic percent after two weeks.

Normally, the ternary compound layer will not be the topmost layer in a structure. Rather, the ternary compound layer may be passivated by some other layer such as silicon nitride, silicon oxide, silicon carbide, or some other organic passivation layer. The above tables show that a ternary compound layer produced with a high nitrogen gas flow rate may go at least as long as 2 weeks before a passivation layer is deposited thereon. In one embodiment, the ternary compound layer produced with a high nitrogen gas flow rate and without annealing may go as long as 3 weeks before a passivation layer is deposited thereon. In another embodiment, the ternary compound layer produced with a high nitrogen gas flow rate annealed at 400 degrees Celsius may go as long as 4 weeks before a passivation layer is deposited thereon.

Because both nitrite and nitride components are present in the ternary compound, a peak for both the nitride and the nitrite may be seen in X-ray Photoelectron Spectroscopy (XPS) measurements. The nitrite peak may be present between about 399 and 404 eV binding energy with an intensity of between about 5,500 to about 12,000 while the nitride may be present between about 393 to about 396 eV with an intensity of about 5,500 to about 12,000. The ratio of the nitride peak to the nitrite peak as measured by XPS may fall within the range of about 3:5 to about 5:3. The nitride (N$_2$O) peak may be an artifact due to sputtering the sample which made the oxygen and nitrogen from the film to form a chemical state that is different from the one in the film.

The ternary compound may have a band gap between about 3.1 eV to about 1.2 eV, which equates to about 400 nm to about 1,000 nm. Thus, the ternary compound has a band gap sufficiently low to cover the visible range of light and thus may be useful in solar applications. The band gap energy may be tuned according to the amount of oxygen provided. By providing a higher amount of oxygen, the band gap may be increased. The dependent of band gap to oxygen flow rate is almost independent of nitrogen flow rate in a large flow rate regime. During deposition, the band gap energy for the ternary film may be graded to fine tune the bang gap throughout the film. For example, it may be desirable to have a higher band gap energy near the surface of the ternary compound layer and then adjust the band gap energy throughout the thickness of the ternary compound layer. By controlling the proportionate amount of oxygen provided relative to the amount of argon and nitrogen provided, the band gap energy distribution for the ternary compound may be controlled during deposition.

By reactive sputtering a zinc target in an atmosphere of nitrogen and oxygen where the flow rate of nitrogen is significantly greater than the flow rate of oxygen, a stable semiconductor film may be formed that has a mobility greater than amorphous silicon. It is to be understood that the semiconductor film discussed herein may be produced by other methods besides reactive sputtering.

While the foregoing is directed to embodiments of the present invention, other and further embodiments of the invention may be devised without departing from the basic scope thereof, and the scope thereof is determined by the claims that follow.

The invention claimed is:

1. A semiconductor film comprising a ternary compound of zinc, oxygen, and nitrogen, wherein the semiconductor film has a sheet resistance of between about 100 ohm/sq to about 1×10$^5$ ohm/sq, and wherein the ternary compound comprises ZnN$_x$O$_y$ and a dopant.

2. The semiconductor film of claim 1, wherein the film has a resistivity of between about 0.001 to about 30 ohm-cm.

3. The semiconductor film of claim 1, wherein the film has a mobility of greater than about 30 cm$^2$/V-s.

4. The semiconductor film of claim 3, wherein the film has a mobility of greater than about 90 cm$^2$/V-s.

5. The semiconductor film of claim 1, wherein the film has a transmittance of up to about 80 percent.

6. The semiconductor film of claim 1, wherein the film has a graded band gap energy between about 3.1 eV and about 1.2 eV.

7. The semiconductor film of claim 1, wherein the dopant comprises aluminum.

8. The semiconductor film of claim 1, wherein the semiconductor film has a mobility of greater than about 20 cm$^2$/V-s.

9. The semiconductor film of claim 1, further comprising a passivation portion.

* * * * *